US010861886B2

(12) United States Patent
Jin et al.

(10) Patent No.: US 10,861,886 B2
(45) Date of Patent: Dec. 8, 2020

(54) IMAGE SENSOR AND IMAGE PROCESSING SYSTEM HAVING PIXEL STRUCTURE TO IMPROVE DEMODULATION CONTRAST PERFORMANCE

(71) Applicant: Samsung Electronics Co., Ltd., Suwon-si (KR)

(72) Inventors: Young-gu Jin, Suwon-si (KR); Tae-sub Jung, Hwaseong-si (KR); Young-chan Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/460,440

(22) Filed: Jul. 2, 2019

(65) Prior Publication Data
US 2020/0111823 A1    Apr. 9, 2020

(30) Foreign Application Priority Data

Oct. 5, 2018 (KR) ........................ 10-2018-0119302

(51) Int. Cl.
| *H01L 27/146* | (2006.01) |
| *H04N 5/378* | (2011.01) |
| *G01S 17/89* | (2020.01) |
| *H04N 5/369* | (2011.01) |

(52) U.S. Cl.
CPC ........ *H01L 27/14603* (2013.01); *G01S 17/89* (2013.01); *H01L 27/14605* (2013.01); *H01L 27/14612* (2013.01); *H01L 27/14643* (2013.01); *H04N 5/369* (2013.01); *H04N 5/36961* (2018.08); *H04N 5/378* (2013.01)

(58) Field of Classification Search
CPC ........ H01L 27/14603; H01L 27/14605; H01L 27/14612; H01L 27/14629; H01L 27/14643; H04N 5/369; H04N 5/3696; H04N 5/36961; H04N 5/378; G01S 17/89; G01S 17/894
See application file for complete search history.

(56) References Cited

U.S. PATENT DOCUMENTS

| 6,906,793 B2 | 6/2005 | Bamji et al. |
| 7,671,391 B2 | 3/2010 | Kawahito |
| 8,598,674 B2 | 12/2013 | Mase et al. |

(Continued)

FOREIGN PATENT DOCUMENTS

| KR | 10-2011-0090501 A | 8/2011 |
| KR | 10-2012-0080533 A | 7/2012 |

(Continued)

*Primary Examiner* — Stephen W Smoot
(74) *Attorney, Agent, or Firm* — Harness, Dickey & Pierce, P.L.C.

(57) ABSTRACT

An image sensor including a light source configured to emit an optical signal to a target object, and a pixel array including a first pixel configured to generate pixel signals based on the optical signal reflected from the target object, the first pixel including a first photo gate group having at least two photo gates that are configured to receive first gate signals with a first phase difference from the optical signal in a time interval and a second photo gate group having at least two photo gates configured to receive second gate signals with a second phase difference from the optical signal in the time interval, may be provided.

20 Claims, 38 Drawing Sheets

(56) References Cited

U.S. PATENT DOCUMENTS

| | | | |
|---|---|---|---|
| 8,937,711 | B2 | 1/2015 | Kim et al. |
| 8,953,152 | B2 | 2/2015 | Min et al. |
| 9,046,358 | B2 | 6/2015 | Lee et al. |
| 9,076,706 | B2 | 7/2015 | Kim et al. |
| 9,172,972 | B2 | 10/2015 | Chong et al. |
| 9,313,372 | B2 | 4/2016 | Oh et al. |
| 9,442,196 | B2 | 9/2016 | Buettgen et al. |
| 9,859,313 | B2 | 1/2018 | Chang et al. |
| 9,903,941 | B2 | 2/2018 | Jeong et al. |
| 2016/0013226 | A1* | 1/2016 | Shim .................. H04N 5/37452 348/273 |
| 2016/0225805 | A1* | 8/2016 | Keelan .............. H01L 27/14621 |
| 2016/0306045 | A1 | 10/2016 | Van Der Tempel et al. |
| 2018/0003807 | A1 | 1/2018 | Galera et al. |
| 2018/0184036 | A1* | 6/2018 | Sato ......................... G02B 7/34 |
| 2019/0369219 | A1* | 12/2019 | Ercan ..................... G01S 17/36 |
| 2020/0013811 | A1* | 1/2020 | Jin .................... H01L 27/14605 |
| 2020/0116862 | A1* | 4/2020 | Xu .......................... G01S 17/36 |

FOREIGN PATENT DOCUMENTS

| | | |
|---|---|---|
| KR | 10-2013-0105904 A | 9/2013 |
| KR | 10-2015-0000250 A | 1/2015 |
| KR | 10-2016-0032014 A | 3/2016 |

\* cited by examiner

IMAGE SENSOR AND IMAGE PROCESSING SYSTEM HAVING PIXEL STRUCTURE TO IMPROVE DEMODULATION CONTRAST PERFORMANCE

CROSS-REFERENCE TO RELATED APPLICATION

This application claims the benefit of Korean Patent Application No. 10-2018-0119302, filed on Oct. 5, 2018, in the Korean Intellectual Property Office, the disclosure of which is incorporated herein in its entirety by reference.

BACKGROUND

The inventive concepts relate to image sensors and/or image processing systems that has a pixel structure for improving demodulation contrast performance and generates pixel signals needed for measuring depth based on a time of flight (ToF).

A 3-dimensional (3D) image sensor based on a ToF may generate a 3D image of a target object by measuring a distance to the target object or an object to be measured. An image sensor performing a ToF-based distance measurement measures the time until an optical signal pulse emitted from a light source is reflected by a target object and received, calculates a distance to the target object, and generates a 3D image of the target object. As an optical signal output from the light source, for example, a microwave, a light wave, an ultrasonic wave, or the like may be used.

Pixels (or distance pixels) that generate pixel signals for a ToF-based distance measurement in the related art have a problem that the demodulation contrast performance is deteriorated due to a simple doping structure and the structural limitations of pixels in the related art.

SUMMARY

Some example embodiments of the inventive concepts provide image sensors and/or image processing systems having a pixel structure for improving the demodulation contrast performance to accurately measure a distance to a target object to generate a high quality 3D image and performing a pixel generating operation suitable for the pixel structure.

According to an example embodiment of the inventive concepts, an image sensor may include a light source configured to emit an optical signal to a target object, and a pixel array including a first pixel, the first pixel configured to generate pixel signals based on the optical signal reflected from the target object. The first pixel may include a first photo gate group and a second photo gate group, the first photo gate group including at least two photo gates configured to receive first gate signals having a first phase difference from the optical signal in a time interval, the second photo gate group including at least two photo gates configured to receive second gate signals having a second phase difference from the optical signal in the time interval.

According to an example embodiment of the inventive concepts, an image sensor may include a light source configured to emit an optical signal to a target object, and a pixel array comprising a first pixel, the first pixel configured to generate pixel signals based on the optical signal reflected from the target object. The first pixel may include a first photo gate group and a second photo gate group, the first photo gate group including at least two photo gates configured to receive first gate signals each having a phase difference from the optical signal in a time interval, and the second photo gate group including at least two photo gates configured to receive second gate signals having a logic high value in the time interval.

According to an example embodiment of the inventive concepts, an image sensor may include a light source configured to emit an optical signal to a target object, and a pixel array comprising a first pixel, the first pixel configured to generate pixel signals based on the optical signal reflected from the target object. The first pixel may include a first photo gate group and a second photo gate group, the first photo gate group including a plurality of photo gates configured to receive first gate signals each having a variable phase difference from the optical signal in a plurality of time intervals and generate first pixel signals according to a first mode, the second photo gate group including a plurality of photo gates configured to receive second gate signals each having a variable phase difference from the optical signal in the plurality of time intervals and generate second pixel signals according to a second mode.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments will be described in detail with reference to the accompanying drawings.

Figure 1:
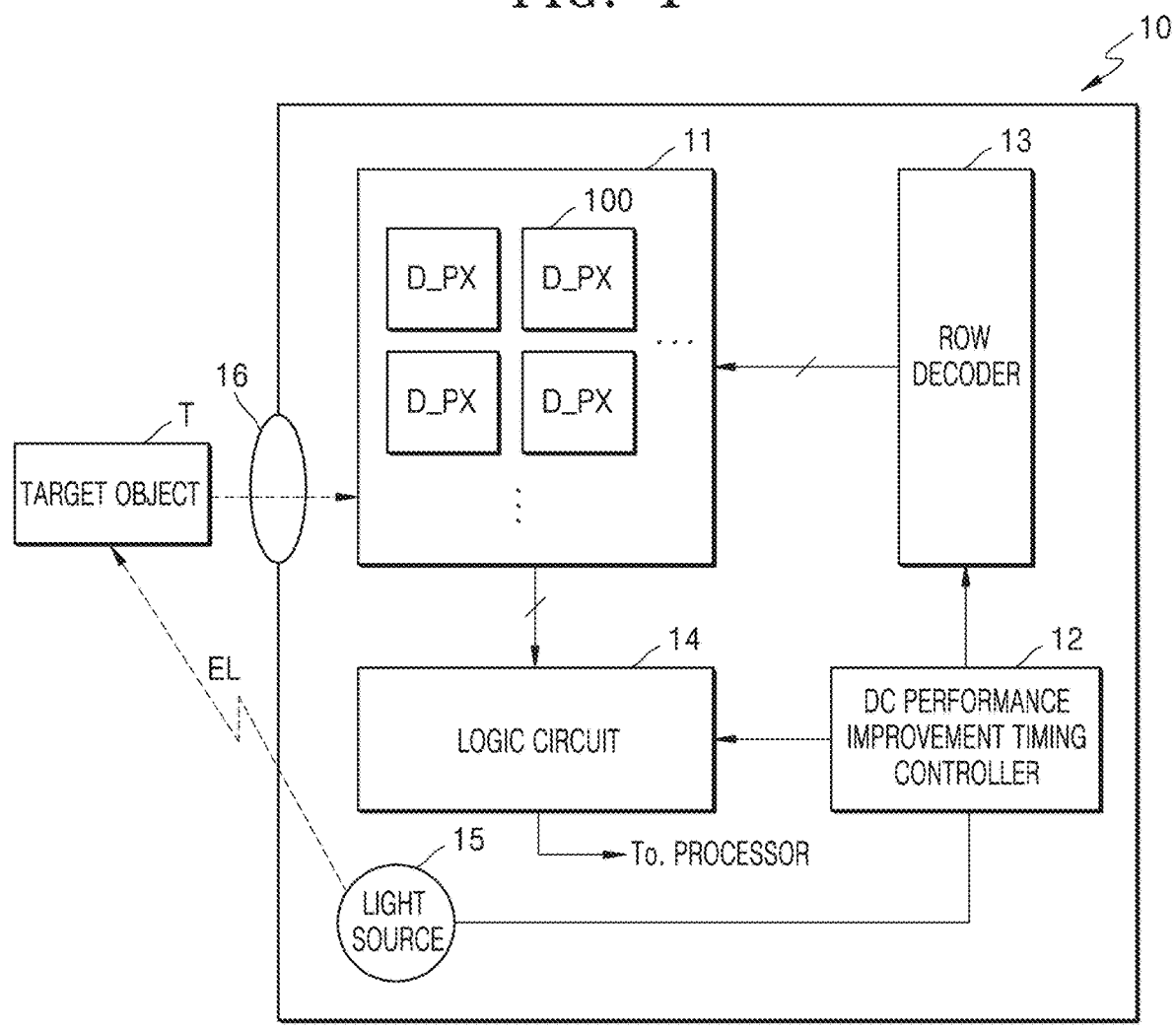
FIG. 1 is a block diagram schematically showing an image sensor according to an example embodiment.

FIG. 1 is a block diagram schematically showing an image sensor according to an example embodiment;

Referring to FIG. 1, an image sensor 10 may include a pixel array 11, a DC performance improvement timing controller 12, a row decoder 13, a logic circuit 14, a light source 15, and a lens 16. An optical signal, which includes repetitive pulse signals irradiated by the light source 15, is reflected by a target object T, and the reflected optical signal may be incident on the image sensor 10 through the lens 16. The image sensor 10 may receive the reflected optical signal and generate pixel signals for measuring a distance to the target object T.

The pixel array 11 may include a plurality of pixels (or distance pixels) 100 arranged in, for example, a 2-dimensional (2D) matrix including rows and columns for receiving an optical signal reflected by the target object T and generating pixel signals needed for measuring a distance. Although not shown in FIG. 1, a plurality of image pixels for generating pixel signals needed for generating an image may be arranged in the pixel array 11. The pixel array 11 may constitute a rectangular imaging region, and the pixels 100 may be accessed by combinations of row addresses and column addresses.

In an example embodiment, a pixel structure for improving demodulation contrast performance may be applied to the pixels 100. The pixel 100 may include n (n is a natural number equal to or greater than 2) tap circuits including n photo gate, respectively. The photo gates may be arranged in correspondence to a plurality of photo gate groups, respectively. In an example embodiment, a photo gate group may be defined as a grouping unit for photo gates to which the same signal (or the same gate signal) is applied during generation of pixel signals for measuring a distance. In another example embodiment, a photo gate group may be defined as a grouping unit for distinguishing photo gates for generating pixel signals for measuring a distance from photo gates for improving demodulation contrast performance. Throughout the disclosure, the terms "[ . . . ] gate(s)" may mean "[ . . . ] transistor" or "[ . . . ] diode."

The DC performance improvement timing controller (hereinafter referred to as a timing controller) 12 may control optical signal generation of the light source 15 and control operation timings of the row decoder 13 and the logic circuit 14. The timing controller 12 may provide timing signals and control signals to the row decoder 13 and the logic circuit 14. The row decoder 13 may generate driving signals (e.g., a transfer signal, a reset signal, a selection signal, etc.) and gate signals for driving each row of the pixel array 11. The row decoder 13 may select the pixels 100 on a row-by-row basis based on driving signals and gate signals.

In an example embodiment, the row decoder 13 may generate different gate signals (and/or driving signals) for respective photo gate groups in the pixel array 11 to appropriately generate pixel signals for measuring a distance in an arrangement structure of the pixels 100, and provide the gate signals to the pixels 100, under the control of the timing controller 12. The pixels 100 may be arranged in various structures to improve the demodulation contrast performance, and the row decoder 13 may appropriately generate pixel signals for accurately measuring a distance according to various example embodiments of arrangement structures of the pixels 100. Detailed examples thereof will be described later.

The logic circuit 14 may process pixel signals generated by the pixels 100 of the pixel array 11 under the control of the timing controller 12, and output processed pixel signals to a processor. The processor may calculate a distance based on the processed pixel signals. According to an example embodiment, the logic circuit 14 may include an analog-to-digital conversion block capable of receiving and converting pixel signals output from the pixel array 11 into digital signals. The logic circuit 14 may further include a correlated double sampling (CDS) block for performing CDS on digital signals output from the analog-to-digital conversion block.

The photo gates in the pixel 100 according to an example embodiment may be arranged in photo gate groups, and the timing controller 12 may control the row decoder 13 to generate gate signals suitable for the structure of the pixel 100 to improve demodulation contrast performance, thereby enabling generation of a high-quality 3D image reflecting an accurate distance to the target object T.

FIGS. 2A to 2F are diagrams for describing deterioration of demodulation contrast performance in existing pixel structures.

Figure 2A:
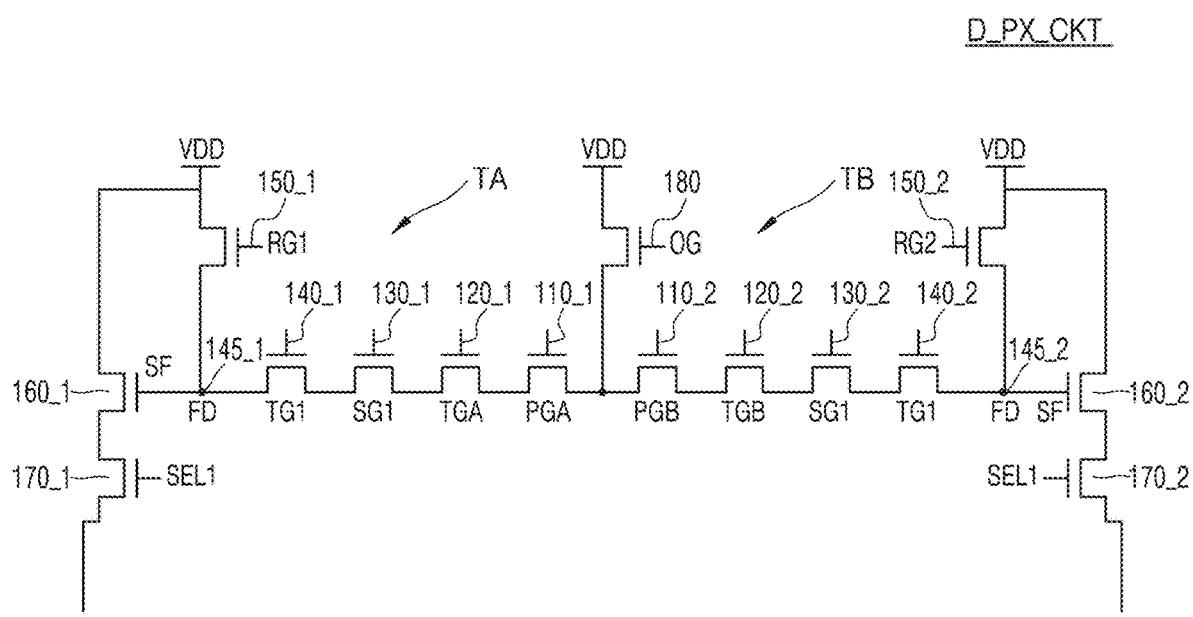
FIGS. 2A to 2F are diagrams for describing deterioration of demodulation contrast performance in existing pixel structures.

FIG. 2A is a circuit diagram of the pixel 100 when the pixel 100 of FIG. 1 is implemented as a 2-tap circuit structure. Referring to FIG. 2A, a pixel circuit D_PX_CKT may include a first tap circuit TA and a second tap circuit TB. The first tap circuit TA and the second tap circuit TB each may include a photo gate 110 for generating charges and gates-for-transfer 120 to 170 for storing and transferring charges. For example, the gates-for-transfer 120 to 170 each may include a tap transfer gate 120, a storage gate 130, a transfer gate 140, a reset gate 150, a source follower gate 160, and a selection gate 170. Hereinafter, a circuit including the reset gate 150, the source follower gate 160, and the selection gate 170 may be referred to as a read-out circuit. The tap transfer gate 120, the storage gate 130, and the transfer gate 140 may function to reduce read noise. According to some example embodiments, the tap transfer gate 120 and the storage gate 130 may be integrated. In some example embodiments, the tap transfer gate 120, the storage gate 130, and the transfer gate 140 may be omitted.

Here, the storage gate 130 is one of charge storage structures. The storage gate 130 may temporarily store charges before transferring the charges to a floating diffusion (FD) region 145 through the transfer gate 140. A charge storage structure may be implemented by the storage gate 130 alone. In some example embodiments, a charge storage structure may be implemented as a structure in which a storage diode (SD) is additionally disposed under the storage gate 130.

For reference, the tap structure of the pixel circuit D_PX_CKT is determined depending on the number of tabs for distinguishing charges generated by the charge storage structure according to phases and transfer of charges, and may usually be a 1-tap structure, a 2-tap structure, or a 4-tap structure. The 1-tap structure may be a structure for transmitting charges for each of phases of 0°, 90°, 180°, and 270° by using one tap. The 2-tap structure may be a structure for transmitting charges for phases of 0° and 180° and phases of 90° and 270° by using two taps. The 4-tap structure may be a structure for transmitting chargers for all phases by using four taps. The 1-tap structure may perform sensing over four steps corresponding to individual phases, the 2-tap structure may perform sensing over two steps, and the 4-tap structure may perform sensing over one step. Therefore, the 2-tap structure and the 4-tap structure may operate at a higher speed than the 1-tap structure. Here, pixel structures having the 2-tap structure and the 4-tap structure will be referred to as multi-tap pixel structures.

Figure 2B:
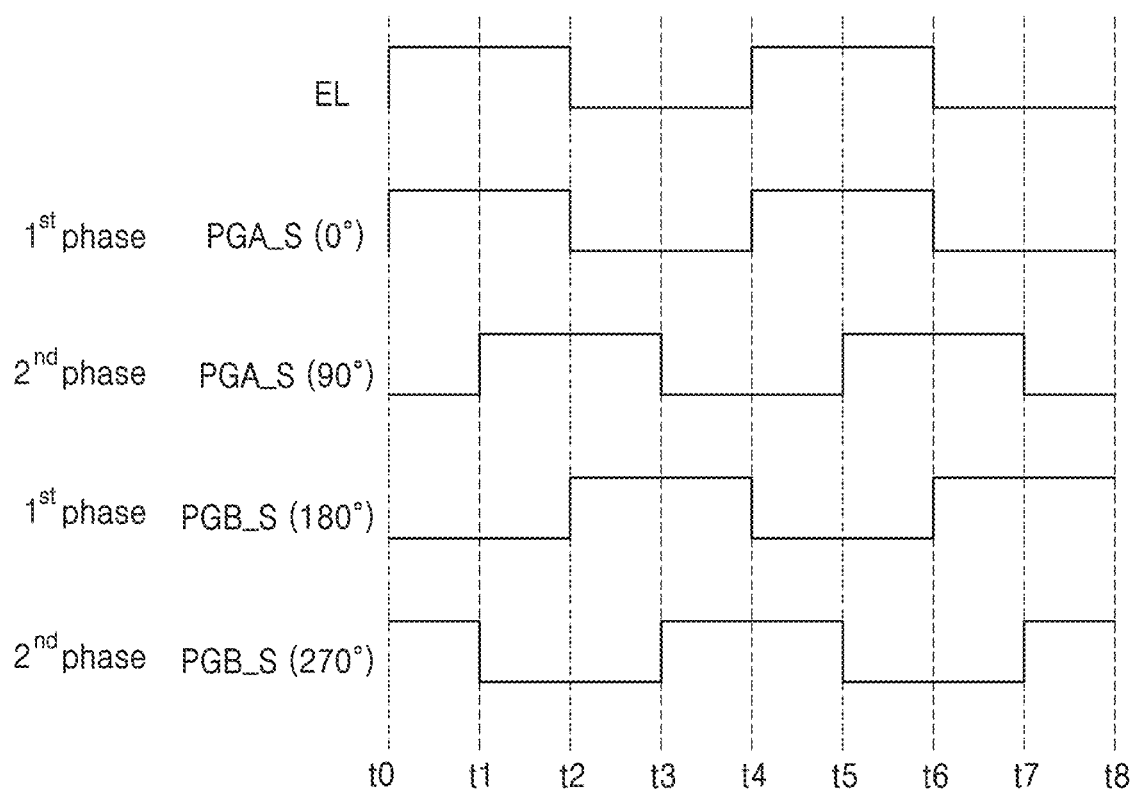

FIG. 2B is a diagram for describing a first gate signal PGA_S and a second gate signal PGB_S applied to the first photo gates 110_1 or PGA and a second photo gate 110_2 or PGB of the pixel circuit D_PX_CKT having the 2-tap structure of FIG. 2A, respectively. Referring to FIG. 2B, the first gate signal PGA_S having the same phase as that of an optical signal EL emitted from the light source 15 (FIG. 1) in a first phase (or a sensing phase) may be applied to the first photo gate 110_1 or PGA, and the second gate signal PGB_S having a phase 180° different from that of the optical signal EL may be applied to the second photo gate 110_2 or PGB. In a second phase, the first gate signal PGA_S having a phase 90° different from that of the optical signal EL may be applied to the first photo gate 110_1 or PGA, and the second gate signal PGB_S having a phase 270° different from that of the optical signal EL may be applied to the second photo gate 110_2 or PGB.

The pixel circuit D_PX_CKT may receive the first gate signal PGA_S and the second gate signal PGB_S, thereby receiving an optical signal corresponding to the optical signal EL reflected by the target object T (FIG. 1), and generating pixel signals. The generated pixel signals may be used to measure the distance to the target object T (FIG. 1).

Figure 2C:
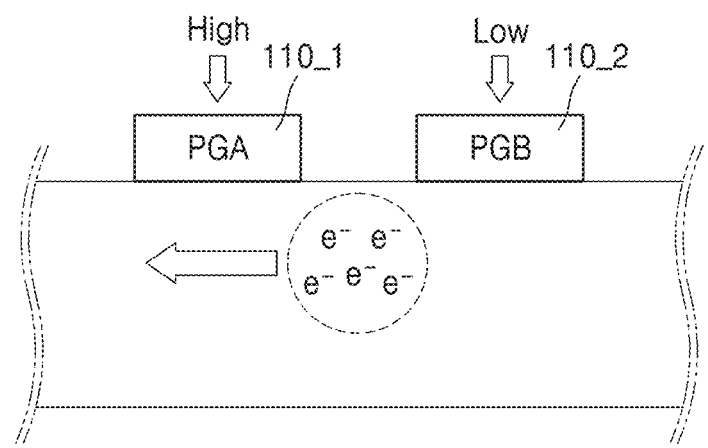

FIG. 2C is a diagram for describing the movement of charges in a certain time interval in FIG. 2B. Referring to FIG. 2C, when the first gate signal PGA_S having a logic high value in a certain time interval is applied to the first photo gate 110_1, and the second gate signal PGB_S having a logic low value in the time interval is applied to the second photo gate 110_2, charges generated by an optical signal reflected by the target object T (FIG. 1) may move in the direction toward the first tap circuit TA including the first photo gate 110_1.

Figure 2D:
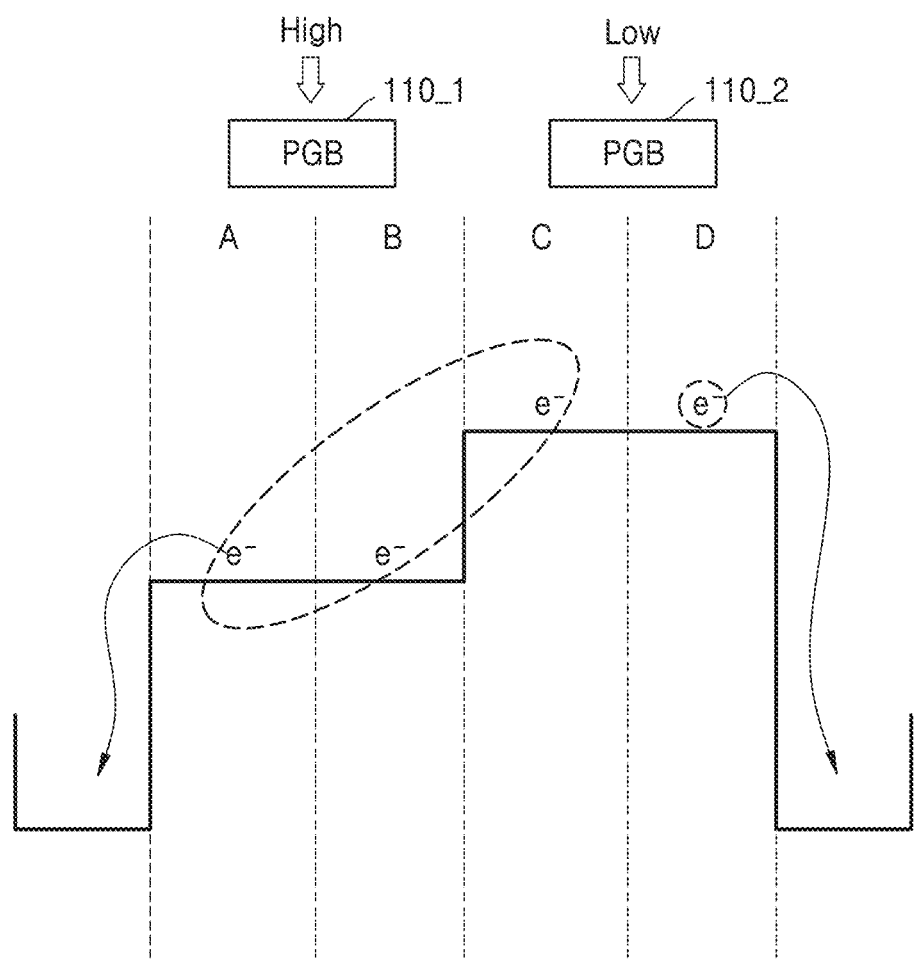

FIG. 2D is a diagram for describing a phenomenon that deteriorates the demodulation contrast performance. Referring to FIG. 2D, when the first gate signal PGA_S being logic high is applied to the first photo gate 110_1 and the second gate signal PGB_S being logic low is applied to the second photo gate 110_2, the energy level as shown in FIG. 2D may be formed. Due to the energy level, charges located in regions 'A' to 'C' may move in the direction toward the first tap circuit TA including the first photo gate 110_1, and charges located in a region 'D' may move in the direction toward the second tap circuit TB including the second photo gate 110_2. Thus, the demodulation contrast performance may deteriorate due to the movements of charges located in the region 'D' as described above due to the structural limitations of a pixel.

Figure 2E:
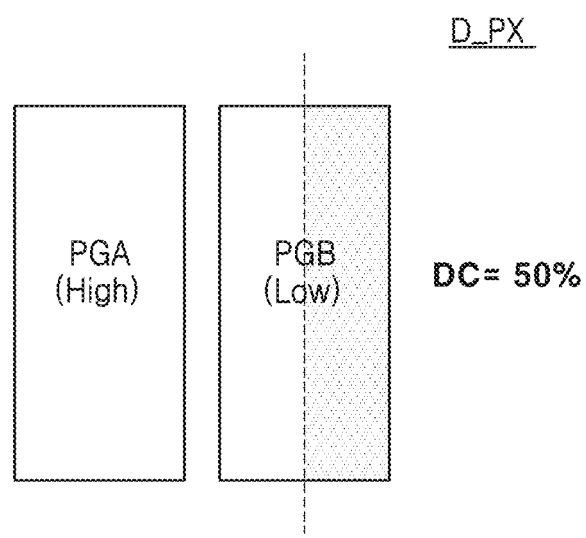

FIG. 2E is a diagram for describing a degree of demodulation contrast of a pixel having a 2-tap structure due to the phenomenon described in FIG. 2D. Referring to FIG. 2E, non-gradated regions of the first photo gate PGA and the second photo gate PGB may correspond to the regions 'A' to 'C' a and gradated region of the second photo gate PGB may correspond to the region 'D' of FIG. 2D. The degree of demodulation contrast may be expressed by the following equation.

$$DC(\text{Demodulation Contrast})(\%) = \frac{\text{tap } signal_{max} - \text{tap } signal_{min}}{\sum \text{tap signal}} \times 100$$

A tap signal may include the flow of charges moving due to application of the first gate signal PGA_S and the second gate signal PGB_S to the first photo gate 110_1 or PGA and the second photo gate 110_2 or PGB. For example, when the first gate signal PGA_S being logic high is applied to the first photo gate PGA and the second gate signal PGB_S being logic low is applied to the second photo gate PGB, a tap signal maximum tap $signal_{max}$ may correspond to the combined area of the ungradated regions of the first photo gate PGA and the second photo gate PGB, a tap signal minimum tap $signal_{min}$ may correspond to the area of the gradated region of the second photo gate PGB, and the tap signal integral/tap signal may correspond to the combined area of the first photo gate PGA and the second photo gate PGB. Thus, the degree of the demodulation contrast of the pixel D_PX having a 2-tap structure in the related art may be calculated as 50% due to the deterioration described with reference to FIG. 2D. However, the degree of demodulation contrast calculated in FIG. 2E is roughly obtained by using the area of regions corresponding to the first photo gate PGA and the second photo gate PGB, and the inventive concepts are not limited thereto.

Figure 2F:
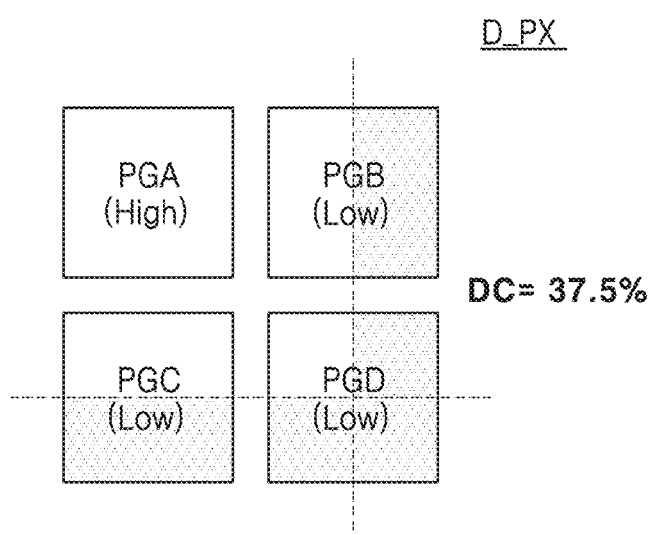

FIG. 2F is a diagram for describing the degree of the demodulation contrast of a pixel having a 4-tap structure due to the phenomenon described with reference to FIG. 2D. Referring to FIG. 2F, the pixel D_PX may be implemented with a 4-tap structure. Thus, in a certain time interval a first gate signal having a logic high value may be applied to the first photo gate PGA and a second gate signal having a logic low value in the time interval may be applied to the second photo gate PGB, a third photo gate PGC, and a fourth photo gate PGD. In this case, when the demodulation contrast of the pixel D_PX having the 4-tap structure can be calculated similarly as in FIG. 2E, a result thereof may be 37.5%. In other words, as shown in FIGS. 2E and 2F, the degree of demodulation contrast in the pixel D_PX having a structure known in the related art can hardly exceed 50%, and thus a distance to the target object T (FIG. 1) may not be accurately measured.

Figure 3A:
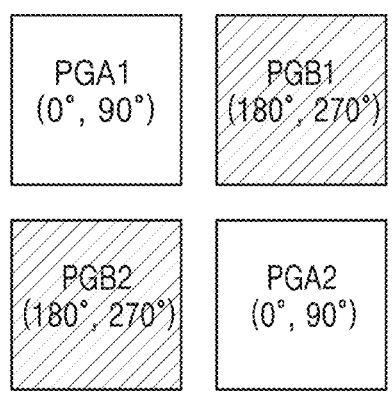
FIG. 3A is a diagram showing a structure of a pixel according to an example embodiment.
Figure 3A:
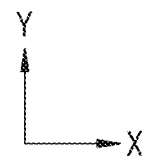
Figure 3B:
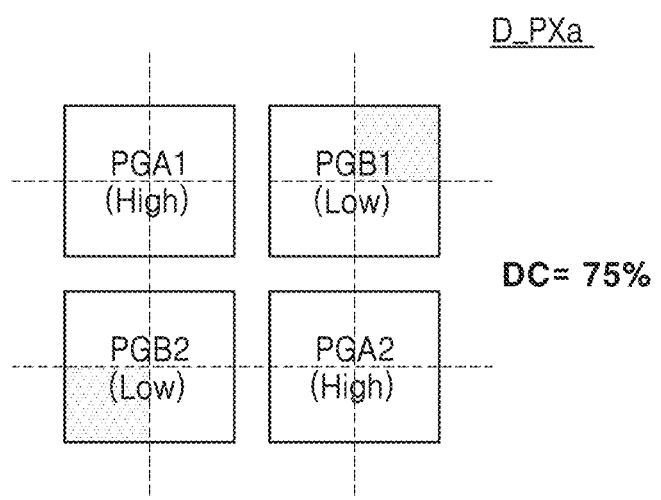
FIG. 3B is a diagram showing the degree of the demodulation contrast when the structure of the pixel of FIG. 3A is employed.

FIG. 3A is a diagram showing a structure of a pixel D_PXa according to an example embodiment, and FIG. 3B is a diagram showing the degree of the demodulation contrast when the structure of the pixel D_PXa of FIG. 3A is employed. The pixel D_PXa described below may be applied to the pixel 100 of FIG. 1.

Referring to FIG. 3A, the pixel D_PXa includes a first photo gate PGA1, a second photo gate PGA2, a third photo gate PGB1, and a fourth photo gate PGB2, wherein the first photo gate PGA1 and the second photo gate PGA2 may be grouped into a first photo gate group, and the third photo gate PGB1 and the fourth photo gate PGB2 may be grouped into a second photo gate group. Within the pixel D_PXa, the first photo gate group and the second photo gate group may intersect each other. In detail, the first photo gate PGA1 and the second photo gate PGA2 in the first photo gate group may be diagonally adjacent to each other, and the third photo gate PGB1 and fourth photo gate PGB2 in the second photo gate group may be diagonally adjacent to each other. The first photo gate PGA1 may be adjacent to the third photo gate PGB1 in an X-axis direction (e.g., first direction or horizontal direction) and may be adjacent to the fourth photo gate PGB2 in a Y-axis direction (e.g., second direction or vertical direction). Furthermore, the second photo gate PGA2 may be adjacent to the fourth photo gate PGB2 in the X-axis direction and may be adjacent to the third photo gate PGB1 in the Y-axis direction.

In an example embodiment, first gate signals having a first phase difference (e.g., 0° or 90°) from an optical signal in a certain time interval for generating pixel signals for measuring a distance may be applied to the first photo gate PGA1 and the second photo gate PGA2 of the first photo gate group, and second gate signals having a second phase difference (e.g., 180° or 270°) from the optical signal in the time interval may be applied to the third photo gate PGB1 and the fourth photo gate PGB2 of the second photo gate group.

In an example embodiment, the pixel D_PXa may have a 4-tap structure including four photo gates (e.g., the first photo gate PGA1, the second photo gate PGA2, the third photo gate PGB1, and the fourth photo gate PGB2). Phases of gate signals of the four photo gates may be adjusted to perform sensing over two time intervals as in a 2-tap structure for generating pixel signals suitable for the structure of the pixel D_PXa, and applied to the first photo gate PGA1, the second photo gate PGA2, the third photo gate PGB1, and the fourth photo gate PGB2.

Referring back to FIG. 3B, when pixel signals for measuring a distance are generated through the structure of the pixel D_PXa of FIG. 3A, the deterioration factors described above with reference to FIG. 2D may be reduced. For example, when first gate signals having a logic high value in a certain time interval are applied to the first photo gate PGA1 and the second photo gate PGA2 and second gate signals having a logic low value in the time interval are applied to the third photo gate PGB1 and the fourth photo gate PGB2, a region like the region 'D' as shown in FIG. 2D may be reduced. In other words, by arranging the first photo gate PGA1 and the second photo gate PGA2 to intersect with the third photo gate PGB1 and the fourth photo gate PGB2, the gradated region may be reduced in FIG. 3B as compared with those in FIGS. 2E and 2F. Thus, the demodulation contrast may be improved to about 75%. The value of the degree of the demodulation contrast is merely an example value derived to describe the effect according to an example embodiment, and effects of the inventive concepts are not limited thereto.

Figure 4:
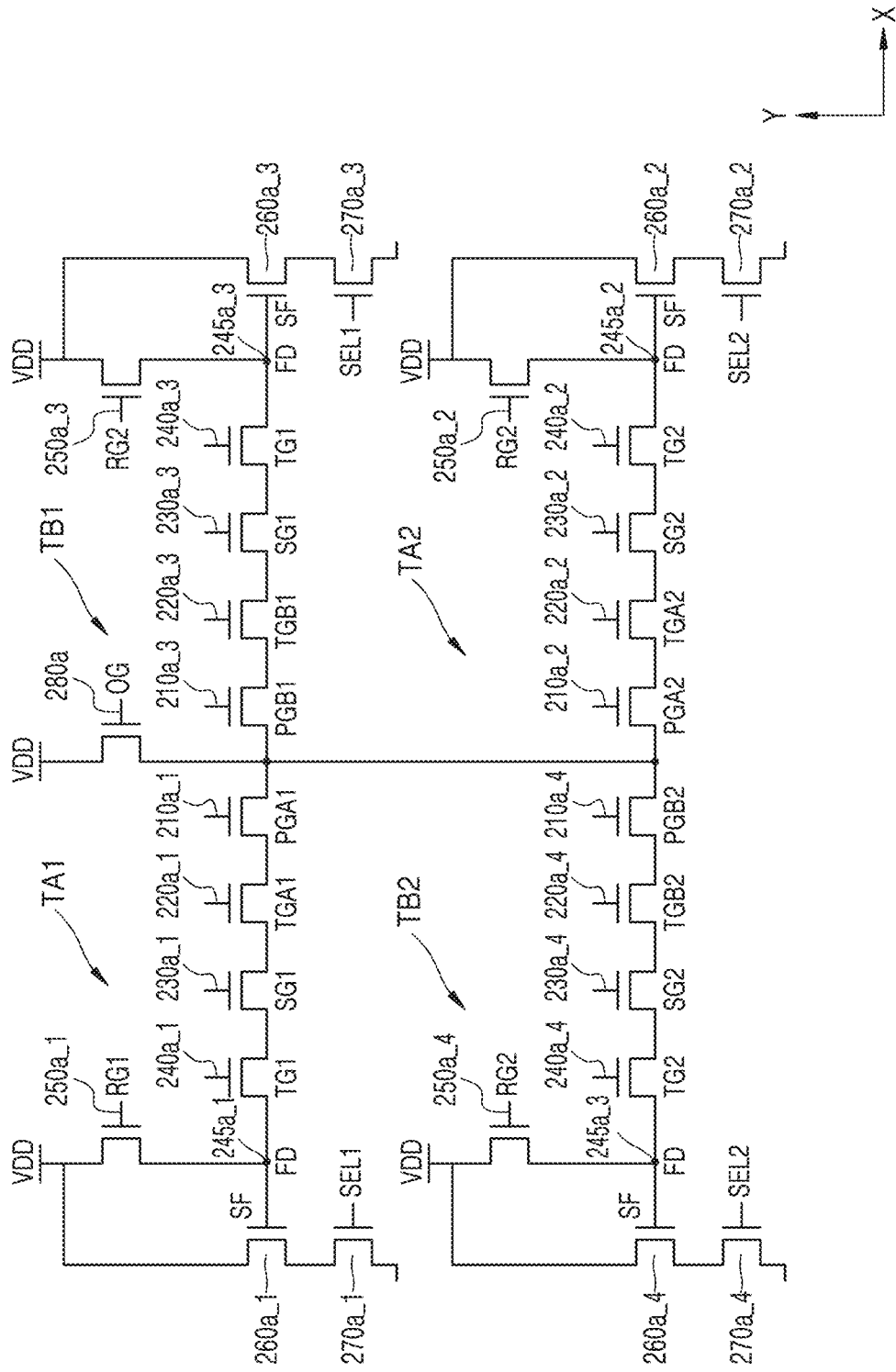
FIG. 4 is a circuit diagram of the pixel in FIG. 3A.

FIG. 4 is a circuit diagram of the pixel D_PXa in FIG. 3A. Hereinafter, the reference numbers of gates included in the first tap circuit TA1 may include '1', and the reference numbers of gates included in the second tap circuit TA2 may include '2', and the reference numbers of gates included in the third tap circuit TB1 may include '3', the reference numbers of gates included in the fourth tap circuit TB2 may include '4'.

Referring to FIG. 4, a pixel circuit D_PX_CKTa may have a 4-tap structure and include a first tap circuit TA1, a second tap circuit TA2, a third tap circuit TB1, and a fourth tap circuit TB2. The first tap circuit TA1, the second tap circuit TA2, the third tap circuit TB1, and the fourth tap circuit TB2 may each include a photo gate 210a that generates charges and gates-for-transfer 220a to 270a that store and transfer charges. Hereinafter, description identical to those given above with reference to FIG. 2A will be omitted.

The first tap circuit TA1 and the second tap circuit TA2 may intersect with the third tap circuit TB1 and the fourth tap circuit TB2. For example, the first tap circuit TA1 and the second tap circuit TA2 may be diagonally adjacent to each other, and the third tap circuit TB1 and the fourth tap circuit TB2 may be diagonally adjacent to each other. The first tap circuit TA1 may be adjacent to the third tap circuit TB1 in the X-axis direction, and the second tap circuit TA2 may be adjacent to the fourth tap circuit TB2 in the X-axis direction.

As described above, first gate signals having a first phase difference from an optical signal may be applied to a first photo gate 210a_1 of the first tap circuit TA1 and a second photo gate 210a_2 of the second tap circuit TA2 in a certain time interval for generating pixel signals for measuring a distance. Second gate signals having a second phase difference with respect to the optical signal may be applied to a third photo gate 210a_3 of the third tap circuit TB1 and a fourth photo gate 210a_4 of the fourth tap circuit TB2.

In an example embodiment, the first tap circuit TA1, the second tap circuit TA2, the third tap circuit TB1, and the fourth tap circuit TB2 each may include a read-out circuit including a reset gate 250a, a source follower gate 260a, and a selection gate 270a.

The first tap circuit TA1, the second tap circuit TA2, the third tap circuit TB1, and the fourth tap circuit TB2 may be connected to read-out circuits included the logic circuit 14 (FIG. 1), respectively. Pixel signals independently output from the first tap circuit TA1, the second tap circuit TA2, the third tap circuit TB1, and the fourth tap circuit TB2 may be provided to the logic circuit 14 (FIG. 1). The logic circuit 14 (FIG. 1) may process the pixel signals and provide the processed pixel signals to a processor.

Figure 5:
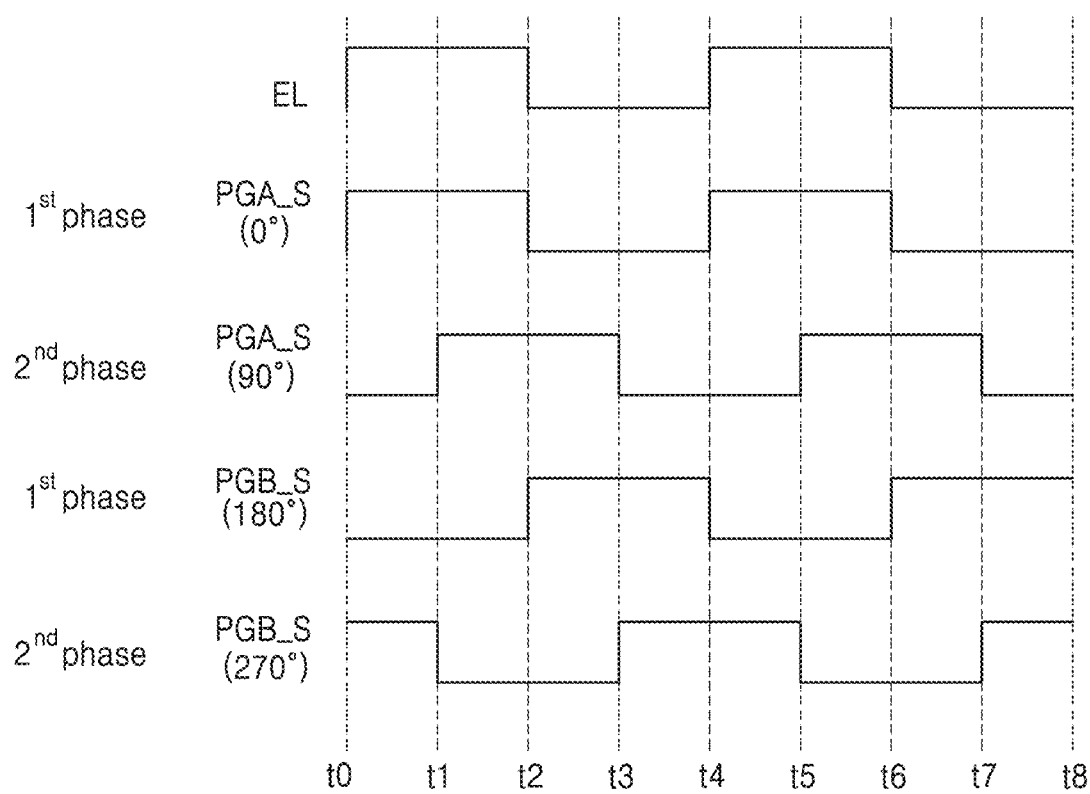
FIG. 5 is a diagram for describing gate signals applied to photo gates of the pixel circuit having a 4-tap structure of FIG. 4.

FIG. 5 is a diagram for describing the first gate signal PGA_S and the second gate signal PGB_S applied to the first photo gate 210a_1, the second photo gate 210a_2, the third photo gate 210a_3, and the fourth photo gate 210a_4 of the pixel circuit D_PX_CKTa having the 4-tap structure as shown in FIG. 4.

Referring to FIG. 5, in the first phase, the first gate signals PGA_S having the same phase as that of the optical signal EL emitted from the light source 15 (FIG. 1) may be applied to the first photo gate 210a_1 and the second photo gate 210a_2, whereas the second gate signals PGB_S having a phase 180° different from that of the optical signal EL may be applied to the third photo gate 210a_3 and the fourth photo gate 210a_4. In the second phase, the first gate signals PGA_S having a phase 90° different from that of the optical signal EL may be applied to the first photo gate 210a_1 and the second photo gate 210a_2, and the second gate signals PGB_S having a phase 270° different from that of the optical signal EL may be applied to the third photo gate 210a_3 and the fourth photo gate 210a_4.

As described above, the pixel circuit D_PX_CKT according to an example embodiment corresponds to a 4-tap structure, but a sensing scheme in a 2-tap structure may be applied thereto.

Figure 6A:
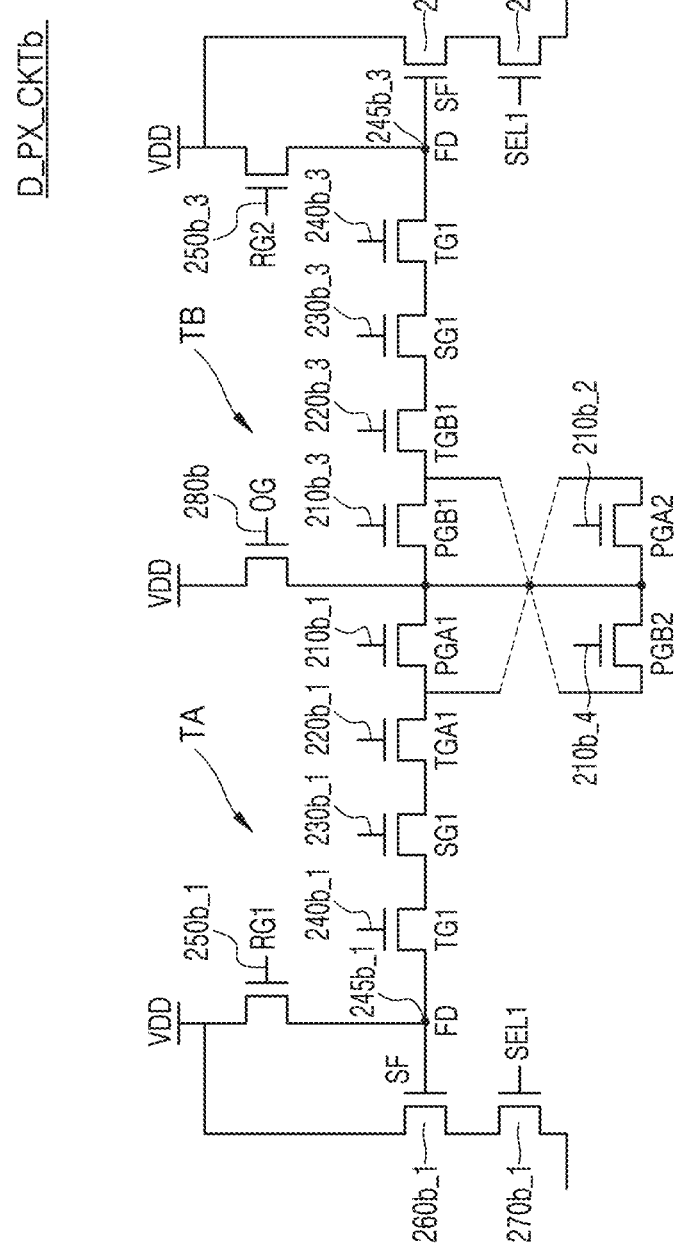
FIGS. 6A and 6B are diagrams showing pixel circuits according some example embodiments.
Figure 6B:
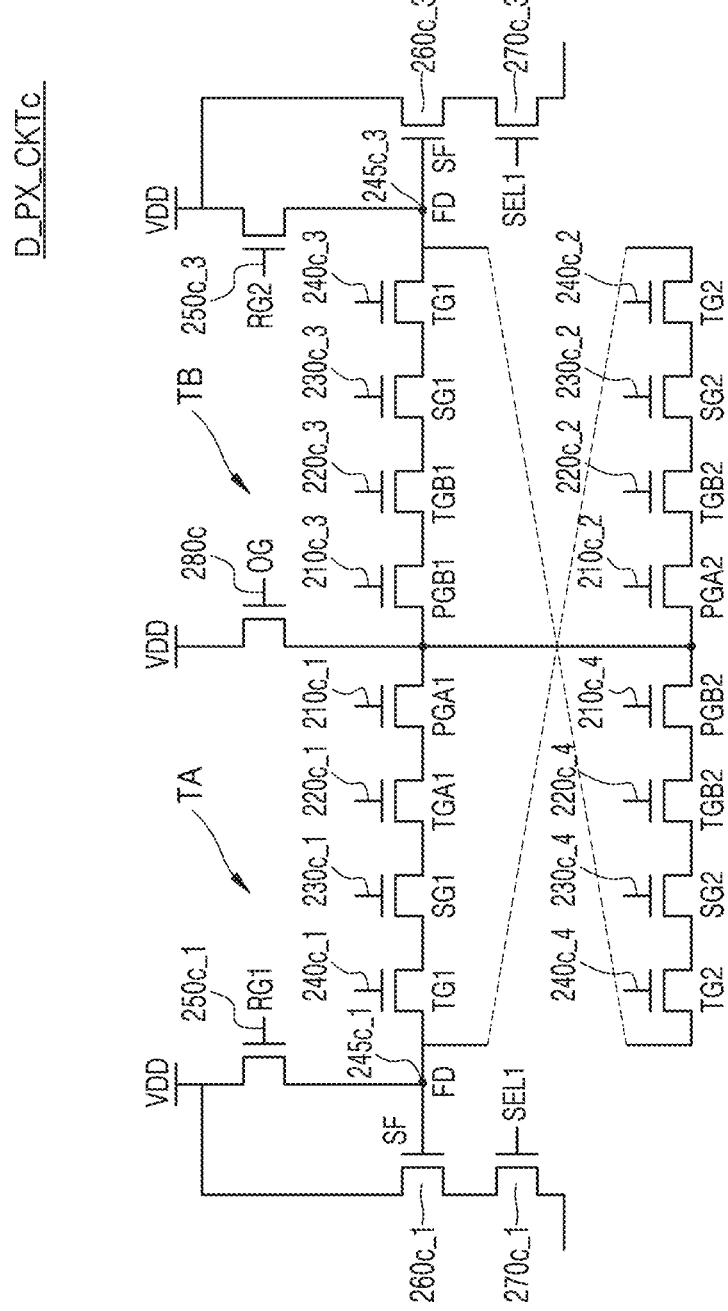

FIGS. 6A and 6B are diagrams showing a pixel circuit D_PX_CKTb and a pixel circuit D_PX_CKTc according to some example embodiments.

Referring to FIG. 6A, the pixel circuit D_PX_CKTb differs from the pixel circuit D_PX_CKTa of FIG. 4 in that the first tap circuit TA1 and the second tap circuit TA2 may share one charge storage and the third tap circuit TB1 and the fourth tap circuit TB2 may share one charge storage. For the structure of sharing charge storages, one end of a second photo gate 210b_2 of the second tap circuit TA2 may be connected to one end of a first tap transfer gate 220b_1 of the first tap circuit TA1 and one end of a fourth photo gate 210b_4 of the fourth tap circuit TB2 may be connected to one end of a third tap transfer gate 220b_3 of the third tap circuit TB1.

Referring to FIG. 6B, the pixel circuit D_PX_CKTc differs from the pixel circuit D_PX_CKTa of FIG. 4 in that the first tap circuit TA1 and the second tap circuit TA2 may share a read-out circuit including a first reset gate 250c_1, a first source follower gate 260c_1, and a first selection gate 270c_1, whereas the third tap circuit TB1 and the fourth tap circuit TB2 may share a read-out circuit including a third reset gate 250c_3, a third source follower gate 260c_3, and a third selection gate 270c_3. The configurations of the pixel circuit D_PX_CKTa, the pixel circuit D_PX_CKTb, and the pixel circuit D_PX_CKTc having the 4-tap structures as shown in FIGS. 4, 6A, and 6B are merely examples, and the inventive concepts are not limited thereto.

Figure 7A:
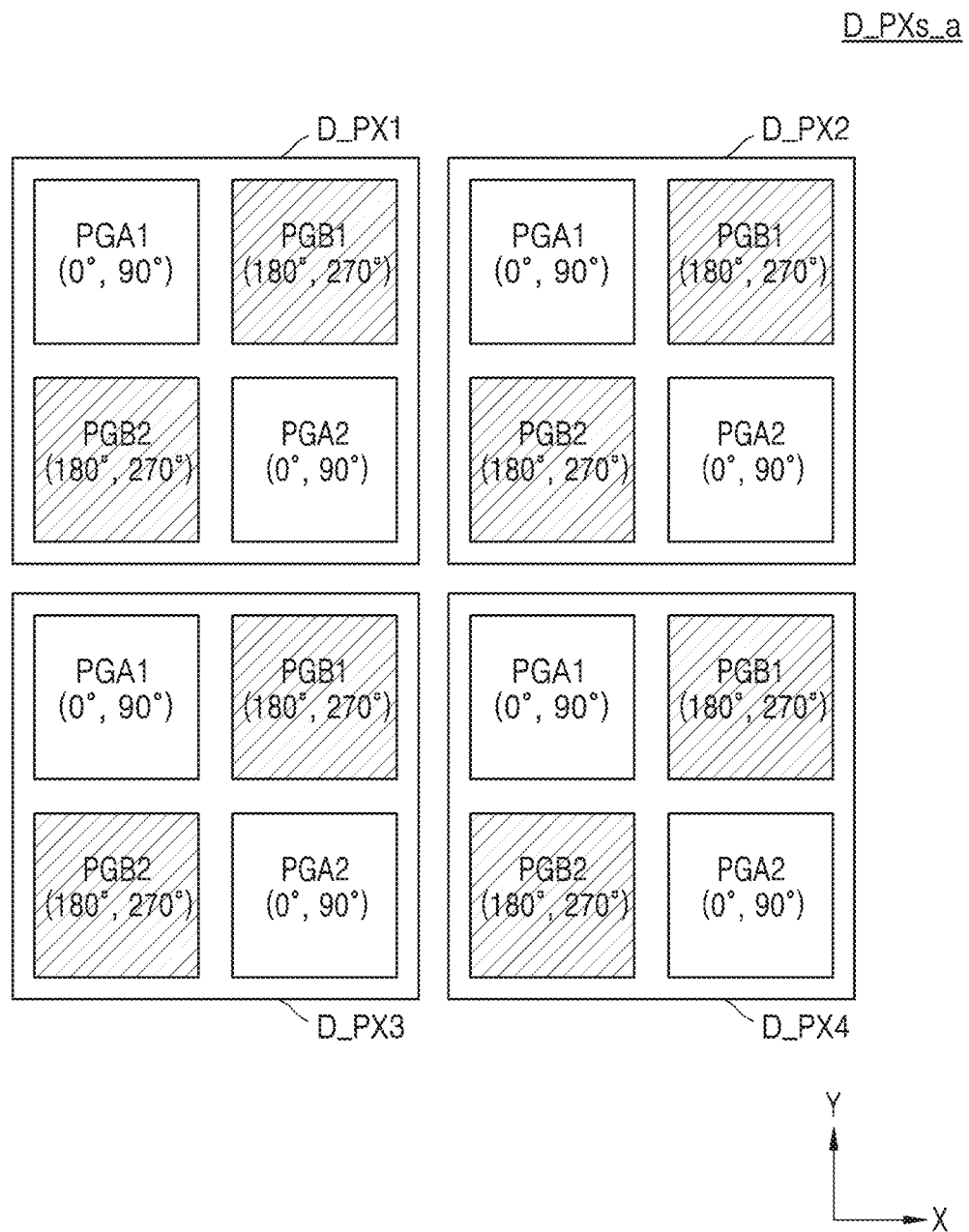
FIGS. 7A and 7B are diagrams for describing photo gate group arrangement patterns of pixels according to some example embodiments.
Figure 7B:
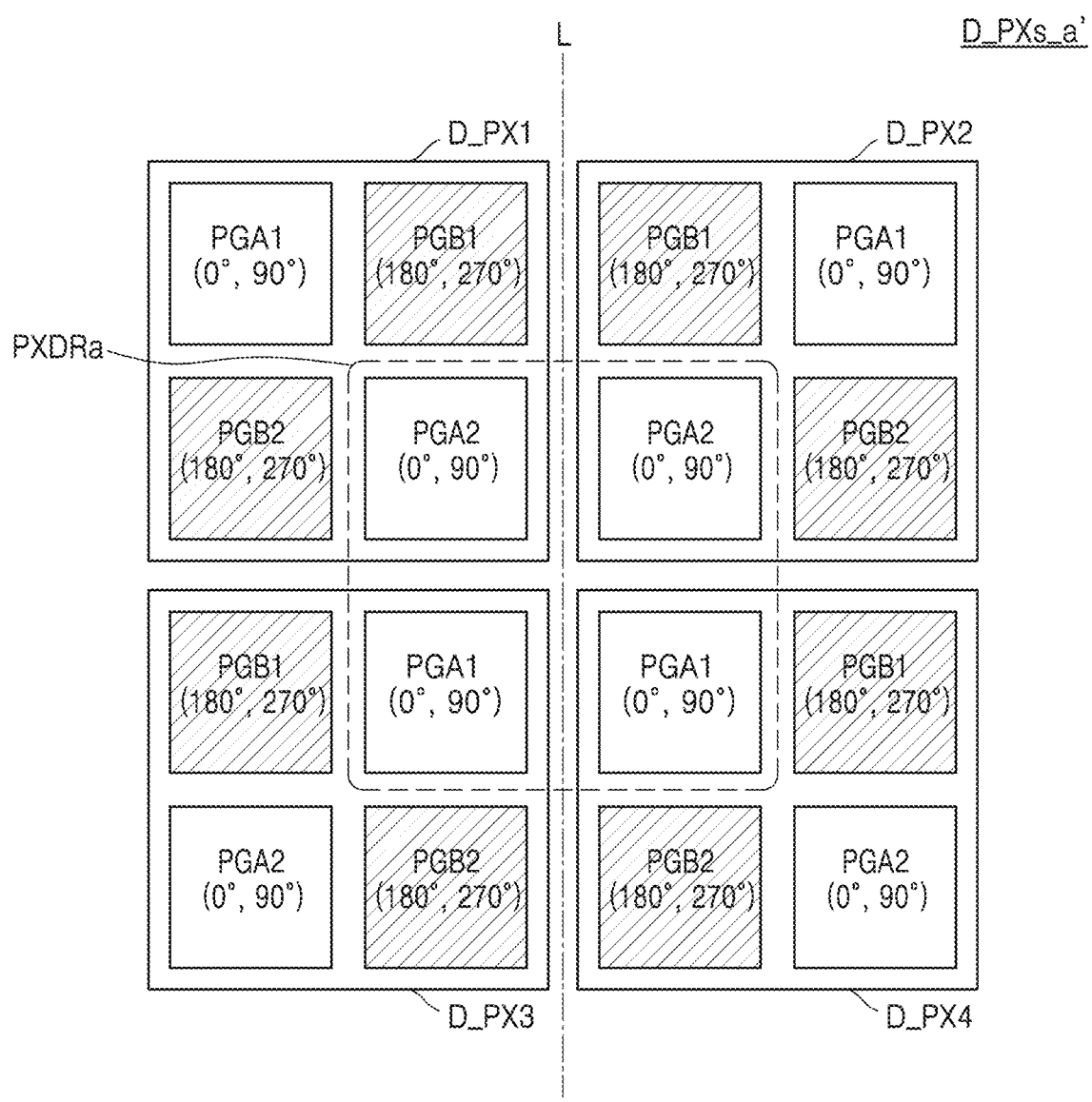

FIGS. 7A and 7B are diagrams for describing photo gate group arrangement patterns regarding pixels D_PXs_a and pixels D_PXs_a' according to some example embodiments.

Referring to FIG. 7A, the pixels D_PXs_a may include a first pixel D_PX1, a second pixel D_PX2, a third pixel D_PX3, and a fourth pixel D_PX4. The first pixel D_PX1, the second pixel D_PX2, the third pixel D_PX3, and the fourth pixel D_PX4 may have the same photo gate group arrangement pattern. For example, the first photo gate PGA1 and the second photo gate PGA2 of a first photo gate group in the first pixel D_PX1 may intersect with the third photo gate PGB1 and a fourth photo gate PGB2 of the second photo gate group. The photo gate arrangement pattern of the first pixel D_PX1 may be applied to the second pixel D_PX2, the third pixel D_PX3, and the fourth pixel D_PX4.

Referring to FIG. 7B, the photo gate arrangement pattern of each of the first pixel D_PX1, the second pixel D_PX2, the third pixel D_PX3, and the fourth pixel D_PX4 may be different from the photo gate arrangement pattern of pixels adjacent thereto in the X-axis direction and the Y-axis direction and may be identical to the photo gate arrangement pattern of pixels adjacent thereto in diagonal directions. For example, the photo gate arrangement pattern of the first pixel D_PX1 may be different from the photo gate arrangement patterns of the second pixel D_PX2 and the third pixel D_PX3, and may be identical to the photo gate arrangement pattern of the fourth pixel D_PX4. In an example embodiment, the photo gate arrangement pattern of pixels D_PXs_a' may be symmetrical around a line 'L' that passes through the center of the pixels D_PXs_a' in the Y-direction.

Accordingly, in a phase for generating pixel signals in the pixels D_PXs_a', a region PXDRa where photo gates to which the same gate signals (e.g., gate signals having the same phase difference from an optical signal) are applied are densely arranged may be secured. The distance to the target object T (FIG. 1) may be accurately measured by binning pixel signals of the first pixel D_PX1, the second pixel D_PX2, the third pixel D_PX3, and the fourth pixel D_PX4 corresponding to characteristics of light received through the region PXDRa at various angles.

Figure 8A:
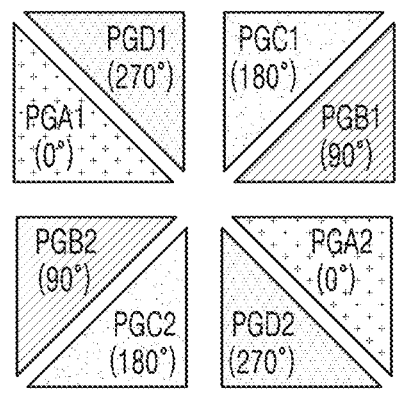
FIG. 8A is a diagram showing a structure of a pixel according to an example embodiment.
Figure 8B:
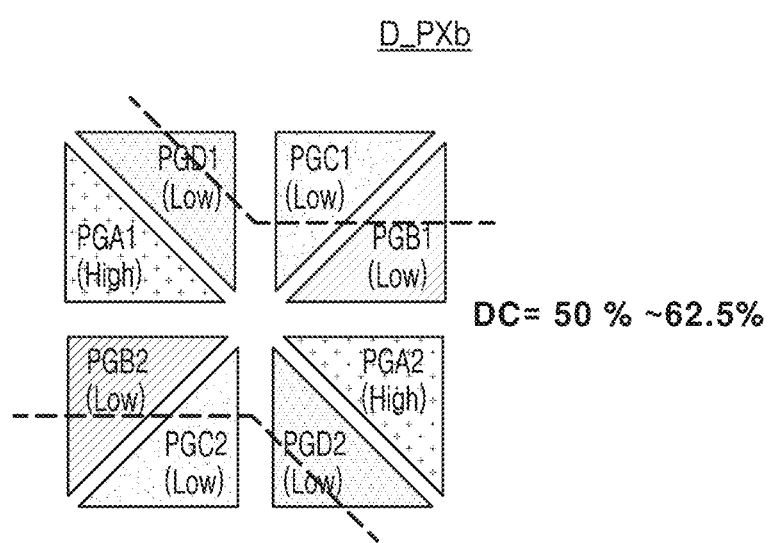
FIG. 8B is a diagram showing the degree of the demodulation contrast when the structure of the pixel of FIG. 8A is employed.

FIG. 8A is a diagram showing a structure of a pixel D_PXb according to an example embodiment, and FIG. 8B is a diagram showing the degree of the demodulation contrast when the structure of the pixel D_PXb of FIG. 8A is employed. The pixel D_PXb described below may be applied to the pixel 100 of FIG. 1.

Referring to FIG. 8A, the pixel D_PXb includes a first photo gate PGA1, a second photo gate PGA2, a third photo gate PGB1, a fourth photo gate PGB2, a fifth photo gate PGC1, a sixth photo gate PGC2, a seventh photo gate PGD1, and an eighth photo gate PGD2. The first photo gate PGA1 and the second photo gate PGA2 may be grouped into a first photo gate group, the third photo gate PGB1 and the fourth photo gate PGB2 may be grouped into a second photo gate group, the fifth photo gate PGC1 and the sixth photo gate PGC2 may be grouped into a third photo gate group, and the seventh photo gate PGD1 and the eighth photo gate PGD2 may be grouped into a fourth photo gate group. Within the pixel D_PXb, the first through fourth photo gate groups may intersect one another. The photo gate arrangement pattern of the pixel D_PXb may be similar to the photo gate arrangement pattern of the pixel D_PXa of FIG. 3A, and thus detailed description thereof will be omitted.

In an example embodiment, first gate signals having a first phase difference (e.g., 0°) from the optical signal in a certain time interval for generating pixel signals for measuring a distance may be applied to the first photo gate PGA1 and the second photo gate PGA2 of the first photo gate group, second gate signals having a second phase difference (e.g., 90°) from the optical signal in the time interval may be applied to the third photo gate PGB1 and the fourth photo gate PGB2 of the second photo gate group, third gate signals having a third phase difference (e.g., 180°) from the optical signal in the time interval may be applied to the fifth photo gate PGC1 and the sixth photo gate PGC2 of the third photo gate group, and fourth gate signals having a fourth phase difference (e.g., 270°) from the optical signal in the time interval may be applied to the seventh photo gate PGD1 and the eighth photo gate PGD2 of the fourth photo gate group.

In an example embodiment, the pixel D_PXb may have an 8-tap structure including eight photo gates (e.g., the first photo gate PGA1, the second photo gate PGA2, the third photo gate PGB1, the fourth photo gate PGB2, the fifth photo gate PGC1, the sixth photo gate PGC2, the seventh photo gate PGD1, and the eighth photo gate PGD2) Phases of gate signals of the eight photo gate may be adjusted to perform sensing over one time interval as in a 4-tap structure for generating pixel signals suitable for the structure of the pixel D_PXb, and may be applied to the first photo gate PGA1, the second photo gate PGA2, the third photo gate PGB1, the fourth photo gate PGB2, the fifth photo gate PGC1, the sixth photo gate PGC2, the seventh photo gate PGD1, and the eighth photo gate PGD2.

Referring to FIG. 8B, when pixel signals for measuring a distance are generated through the structure of the pixel D_PXb of FIG. 8A, the deterioration factors described above with reference to FIG. 2D may be reduced. For example, when gate signals having a logic high value are applied to the first photo gate PGA1 and the second photo gates PGA2 and gate signals having a logic low value are applied to the third photo gate PGB1, the fourth photo gate PGB2, the fifth photo gate PGC1, the sixth photo gate PGC2, the seventh photo gate PGD1, and the eighth photo gate PGD2, a region like the region 'D' as shown in FIG. 2D may be reduced. Thus, in the structure of the pixel D_PXb, the degree of demodulation contrast may be improved from about 50% to about 62.5%. The value of the degree of the demodulation contrast is merely an example value derived to describe the effect according to an example embodiment, and the effect of the inventive concepts are not limited thereto.

Figure 9A:
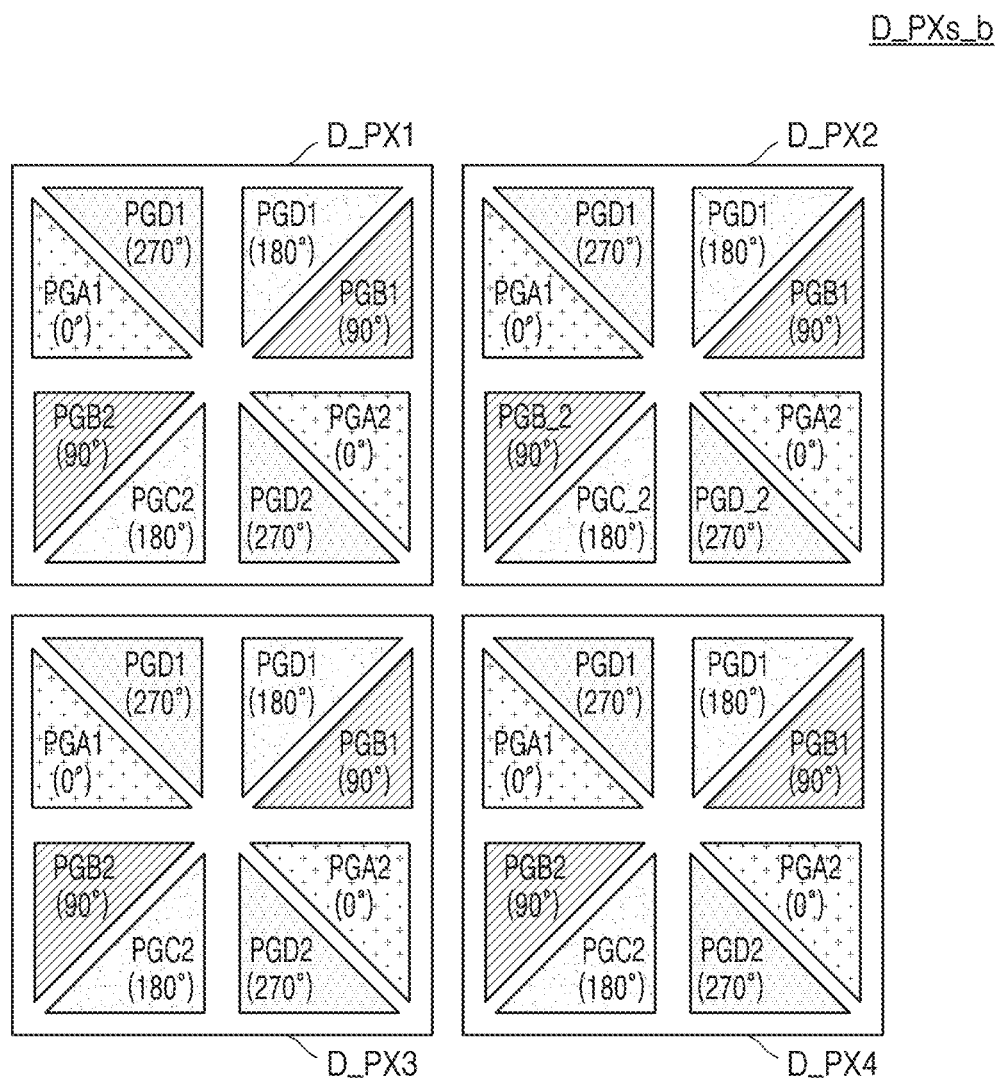
FIGS. 9A and 9B are diagrams for describing photo gate group arrangement patterns of pixels according to some example embodiments.
Figure 9A:
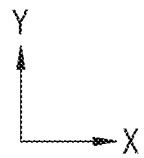
Figure 9B:
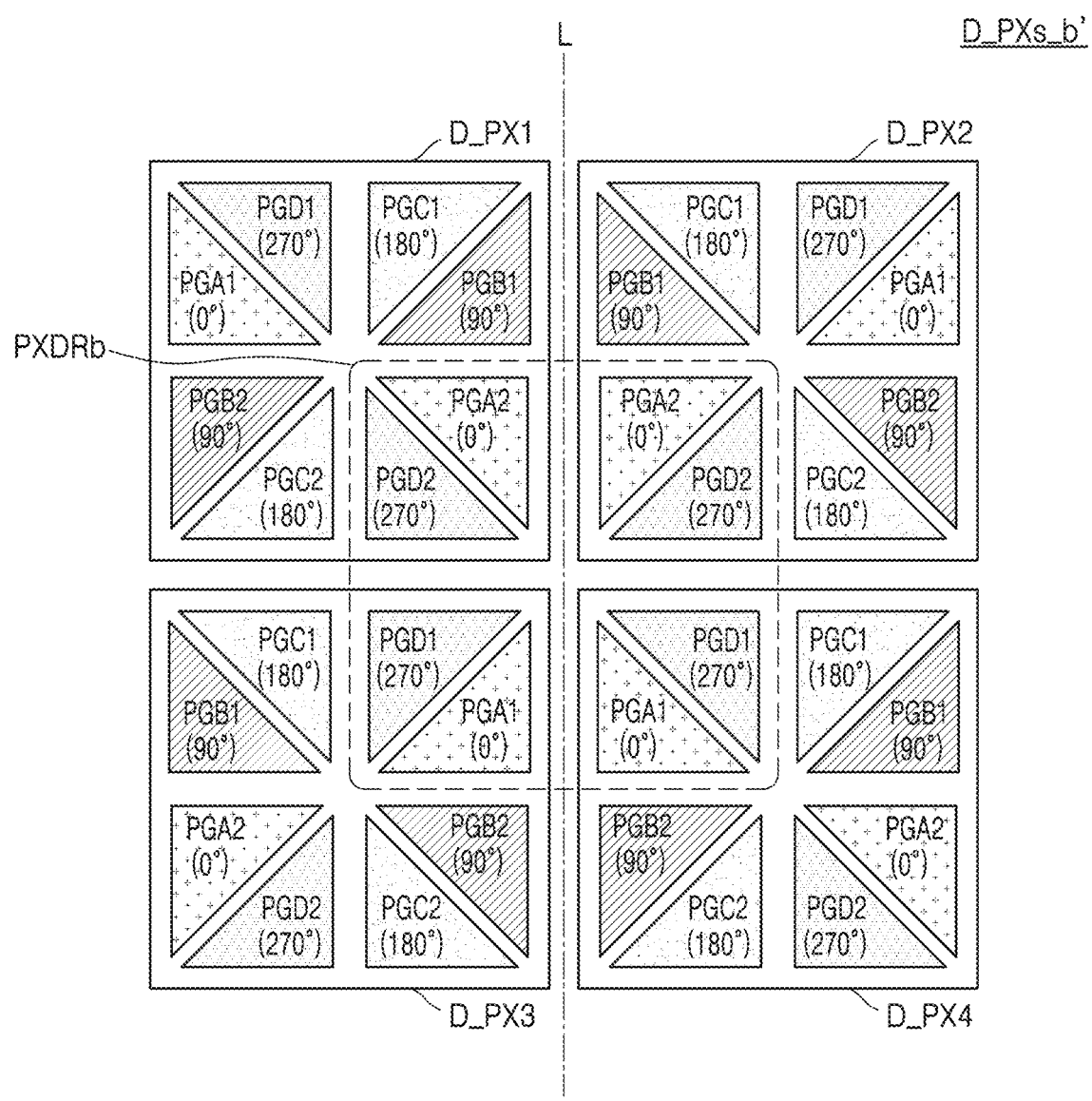

FIGS. 9A and 9B are diagrams for describing photo gate group arrangement patterns regarding pixels D_PXs_b and pixels D_PXs_b' according to some example embodiments.

Referring to FIG. 9A, the pixels D_PXs_b may include the first pixel D_PX1, the second pixel D_PX2, the third pixel D_PX3, and the fourth pixel D_PX4, and the first pixel D_PX1, the second pixel D_PX2, the third pixel D_PX3, and the fourth pixel D_PX4 may have the same photo gate group arrangement pattern. For example, the first photo gate PGA1 and the second photo gate PGA2 of the first photo gate group, the third photo gate PGB1 and the fourth photo gate PGB2 of the second photo gate group, the fifth photo gate PGC1 and the sixth photo gate PGC2 of the third photo gate group, and the seventh photo gate PGD1 and the eighth photo gate PGD2 of the fourth photo gate group in the first pixel D_PX1 may intersect one another, wherein the photo gate arrangement pattern of the first pixel D_PX1 may be applied to the second pixel D_PX2, the third pixel D_PX3, and the fourth pixel D_PX4.

Referring to FIG. 9B, the photo gate arrangement pattern of each of the first pixel D_PX1, the second pixel D_PX2, the third pixel D_PX3, and the fourth pixel D_PX4 may be different from the photo gate arrangement pattern of pixels adjacent thereto in the X-axis direction and the Y-axis direction and may be identical to the photo gate arrangement pattern of pixels adjacent thereto in diagonal directions. For example, the photo gate arrangement pattern of the first pixel D_PX1 may be different from the photo gate arrangement patterns of the second pixel D_PX2 and the third pixel D_PX3 and may be identical to the photo gate arrangement pattern of the fourth pixel D_PX4. In an example embodiment, the photo gate arrangement pattern of pixels D_PXs_b' may be symmetrical around a line 'L' that passes through the center of the pixels D_PXs_b' in the Y-direction.

Accordingly, in a phase for generating pixel signals in the pixels D_PXs_b', a region PXDRb where photo gates to which the same gate signals (e.g., gate signals having the same phase difference from an optical signal) are applied are densely arranged may be secured. The distance to the target object T (FIG. 1) may be accurately measured by binning pixel signals of the first pixel D_PX1, the second pixel D_PX2, the third pixel D_PX3, and the fourth pixel D_PX4 corresponding to characteristics of light received through the region PXDRb at various angles.

Figure 10A:
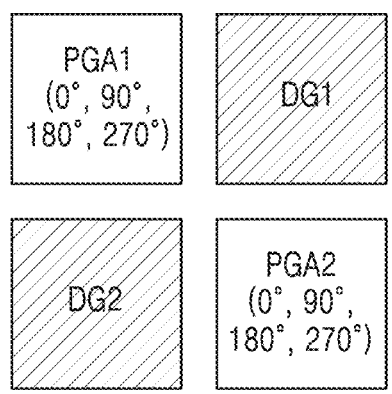
FIG. 10A is a diagram showing a structure of a pixel according to an example embodiment.
Figure 10B:
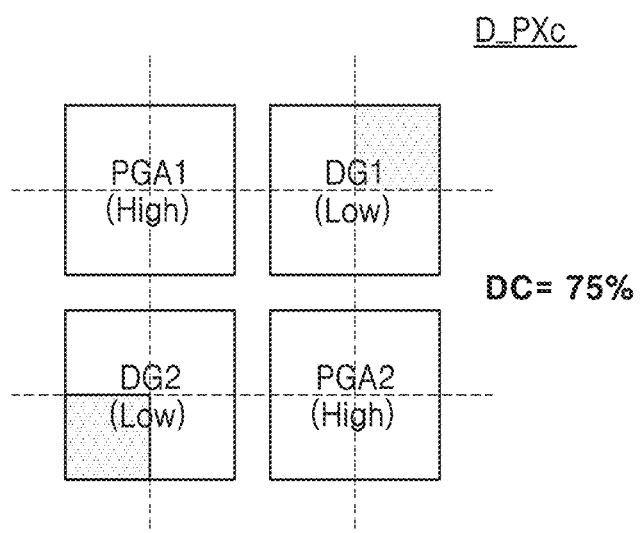
FIG. 10B is a diagram showing the degree of the demodulation contrast when the structure of the pixel of FIG. 10A is employed.

FIG. 10A is a diagram showing a structure of a pixel D_PXc according to an example embodiment, and FIG. 10B is a diagram showing the degree of the demodulation contrast when the structure of the pixel D_PXc of FIG. 10A is employed. The pixel D_PXc described below may be applied to the pixel 100 of FIG. 1.

Referring to FIG. 10A, the pixel D_PXc may include the first photo gate PGA1, the second photo gate PGA2, a first drain gate DG1, and a second drain gate DP2. The first photo gate PGA1 and the second photo gate PGA2 may be grouped into a first photo gate group, and the first drain gate DG1 and the second drain gate DP2 may be grouped into a drain gate group. However, according to some example embodiments, the first drain gate DG1 and the second drain gate DP2 may be referred to as a third photo gate and the fourth photo gate, respectively, and the drain gate group may be referred to as a second photo gate group.

Within the pixel D_PXc, the first photo gate group and the drain gate group may intersect each other. For example, the first photo gate PGA1 and the second photo gate PGA2 in the first photo gate group may be diagonally adjacent to each other, and the first drain gate DG1 and the second drain gate DG2 in the drain gate group may be diagonally adjacent to each other. The first photo gate PGA1 may be adjacent to the first drain gate DG1 in the X-axis direction and may be adjacent to the second drain gate DG2 in the Y-axis direction. Furthermore, the second photo gate PGA2 may be adjacent to the second drain gate DG2 in the X-axis direction and may be adjacent to the first drain gate DG1 in the Y-axis direction.

In an example embodiment, first gate signals having a first phase difference (e.g., 0° or 90°, 270°, or 360°) from an optical signal in a certain time interval for generating pixel signals for measuring a distance may be applied to the first photo gate PGA1 and the second photo gate PGA2 of the first photo gate group.

In an example embodiment, the pixel D_PXa may have a 4-tap structure, wherein gate signals of which phases are adjusted to perform sensing over four time intervals as in an 1-tap structure for generating pixel signals suitable for the structure of the pixel D_PXb may be applied to the first photo gate PGA1 and the second photo gate PGA2.

Referring back to FIG. 10B, when pixel signals for measuring a distance are generated through the structure of the pixel D_PXc of FIG. 10A, the deterioration factors described above with reference to FIG. 2D may be reduced. For example, in a time interval during which first gate signals having a logic high value are applied to the first photo gate PGA1 and the second photo gate PGA2 and second gate signals having a logic low value are applied to the first drain gate DG1 and the second drain gate DG2, a region like the region 'D' as shown in FIG. 2D may be reduced. Thus, in the structure of the pixel D_PXc, the degree of demodulation contrast may be improved to about 75%. The value of the degree of the demodulation contrast is merely an example value derived to describe the effect according to an example embodiment, and the effect of the inventive concepts are not limited thereto.

Figure 11:
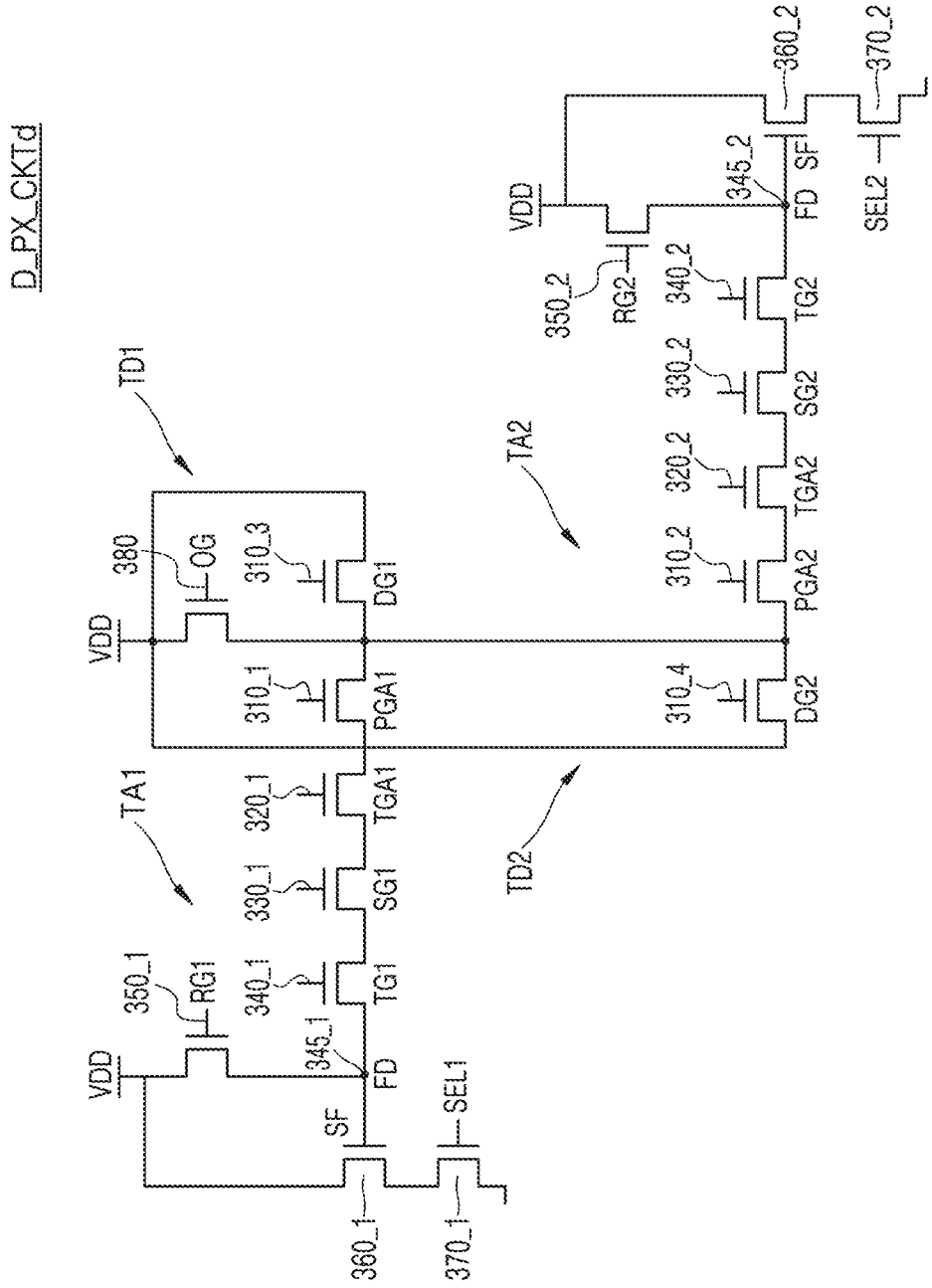
FIG. 11 is a circuit diagram for the pixel of FIG. 10A according to an example embodiment.

FIG. 11 is a circuit diagram for the pixel D_PXc of FIG. 10A according to an example embodiment.

Referring to FIG. 11, a pixel circuit D_PX_CKTd may have a 4-tap structure and include the first tap circuit TA1, the second tap circuit TA2, a third tap circuit TD1, and a fourth tap circuit TD2. The pixel circuit D_PX_CKTd may differ in the structures of the third tap circuit TD1 and the fourth tap circuit TD2 compared to the pixel circuit D_PX_CKTa of FIG. 4. The third tap circuit TD1 may include a first drain gate 310_3 of which one end is directly connected to a power voltage VDD, and the fourth tap circuit TD2 may include a second drain gate 310_4 of which one end is directly connected to the power voltage VDD. The other configurations of the pixel circuit D_PX_CKTd is similar to those of the pixel circuit D_PX_CKTa of FIG. 4, and descriptions identical to those already given above will be omitted.

Figure 12A:
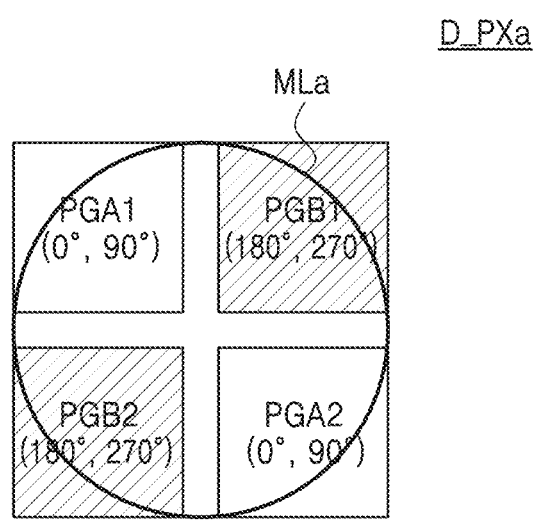
FIGS. 12A to 12C are diagrams showing micro-lens arrangements on the pixel of FIG. 3A according to some example embodiments.
Figure 12B:
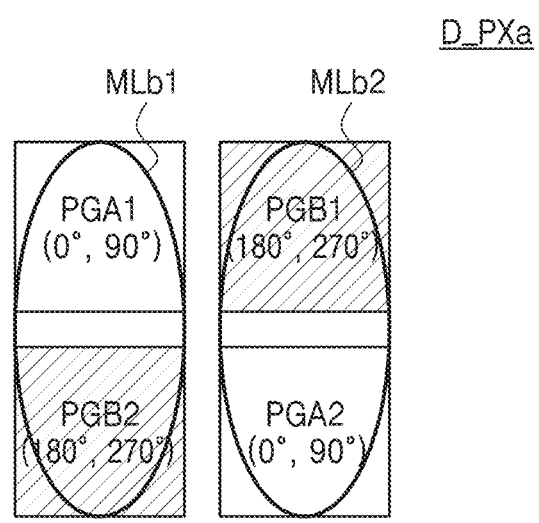
Figure 12C:
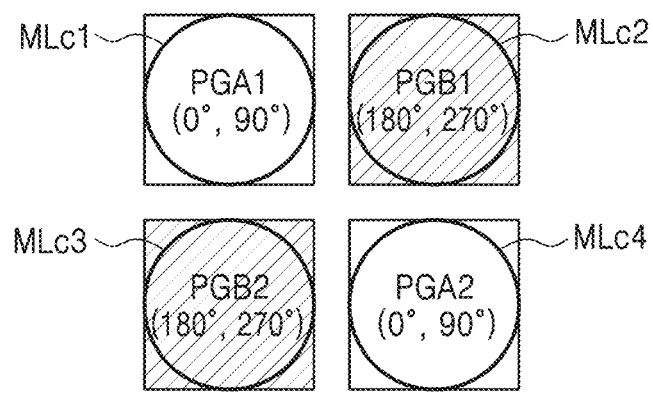

FIGS. 12A to 12C are diagrams showing micro-lens arrangements on the pixel D_PXa of FIG. 3A according to some example embodiments.

Referring to FIG. 12A, one micro-lens MLa may be on the pixel D_PXa. For example, the micro-lens MLa may be commonly on a first photo gate PGA1, a second photo gate PGA2, a third photo gate PGB1, and a fourth photo gate PGB2.

Referring to FIG. 12B, two micro-lenses including a first micro-lens MLb1 and a second micro-lens MLb2 may be on the pixel D_PXa. For example, the first micro-lens MLb1 may be commonly on the first photo gate PGA1 of the first photo gate group and the fourth photo gate PGB2 of the second photo gate group, and the second micro-lens MLb2 may be commonly on the second photo gate PGA2 of the first photo gate group and the third photo gate PGB1 of the second photo gate group.

Referring to FIG. 12B, four micro-lenses including first to fourth micro-lenses MLc1 to MLc4 may be on the pixel D_PXa. For example, the first to fourth micro-lenses MLc1 to MLc4 may be independently arranged on the first photo gate PGA1, the second photo gate PGA2, the third photo gate PGB1, and the fourth photo gate PGB2, respectively.

Figure 13A:
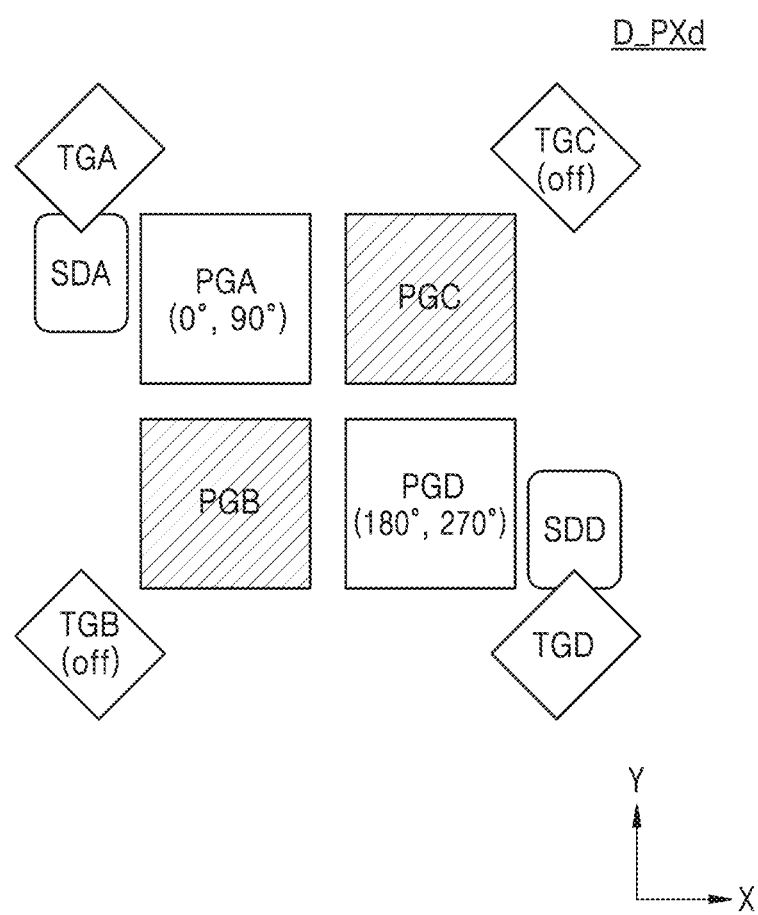
FIG. 13A is a diagram showing a structure of a pixel according to an example embodiment.
Figure 13B:
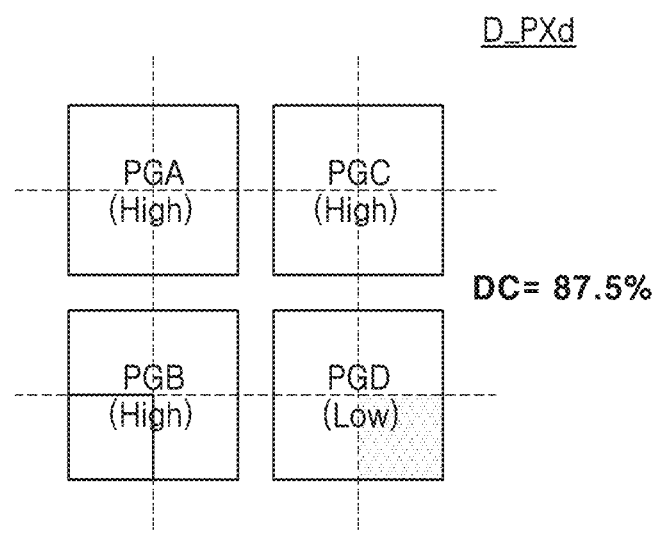
FIG. 13B is a diagram showing the degree of the demodulation contrast when the structure of the pixel of FIG. 13A is employed.

FIG. 13A is a diagram showing a structure of a pixel D_PXd according to an example embodiment, and FIG. 13B is a diagram showing the degree of the demodulation contrast when the structure of the pixel D_PXd of FIG. 13A is employed. The pixel D_PXd described below may be applied to the pixel 100 of FIG. 1.

Referring to FIG. 13A, the pixel D_PXd may include a first photo gate PGA, a second photo gate PGD, a third photo gate PGB, and a fourth photo gate PGC. The first photo gate PGA and the second photo gate PGD may be grouped into a first photo gate group, and the third photo gate PGB and the fourth photo gate PGC may be grouped into a second photo gate group. The first photo gate PGA and the second photo gate PGD are photo gates used to generate pixel signals for measuring a distance, and the third photo gate PGB and the fourth photo gate PGC are photo gates for improving demodulation contrast performance. Therefore, a first charge storage SDA corresponding to the first photo gate PGA and a second charge storage SDD corresponding to the second photo gate PGD may be used to generate pixel signals for measuring a distance. According to some example embodiments of the pixel D_PXd, a charge storage may be variously implemented as a storage diode, a storage gate, etc.

Within the pixel D_PXd, the first photo gate group and the second photo gate group may intersect each other. For example, the first photo gate PGA and the second photo gate PGD in the first photo gate group may be diagonally adjacent to each other, and the third photo gate PGB and fourth photo gate PGC in the second photo gate group may be diagonally adjacent to each other. The first photo gate PGA may be adjacent to the third photo gate PGB in the X-axis direction and may be adjacent to the fourth photo gate PGC in the Y-axis direction. Furthermore, the second photo gate PGD may be adjacent to the fourth photo gate PGC in the X-axis direction and may be adjacent to the third photo gate PGB in the Y-axis direction.

In an example embodiment, a first gate signal having a first phase difference (e.g., 0° or 90°) from an optical signal may be applied to the first photo gate PGA of the first photo gate group in a certain time interval for generating pixel signals for measuring a distance, a second gate signal having a second phase difference (e.g., 180° or 270°) from the optical signal may be applied to the second photo gate PGD of the first photo gate group in the time interval, and signals having a logic high value may be applied to the third photo gate PGB and the fourth photo gate PGC of the second photo gate group in the time interval. Furthermore, in the time interval, a third tap transfer gate TGB connected to the third photo gate PGB and a fourth tap transfer gate TGC connected to the fourth photo gate PGC may be controlled to be turned OFF.

In an example embodiment, the pixel D_PXa may have a 4-tap structure including four photo gates (e.g., the first photo gate PGA, the second photo gate PGD, the third photo gate PGB, and the fourth photo gate PGC) Phases of gate signals of the four photo gates may be adjusted to perform sensing over two time intervals as in a 2-tap structure for generating pixel signals suitable for the structure of the pixel D_PXd and may be applied to the first photo gate PGA and the second photo gate PGD.

Referring to FIG. 13B, when pixel signals for measuring a distance are generated through the structure of the pixel D_PXd of FIG. 13A, the deterioration factors described above with reference to FIG. 2D may be reduced. For example, when signals having a logic high value in a certain time interval are applied to the first photo gate PGA, the third photo gate PGB, and the fourth photo gate PGC and a signal having a logic low value is applied to the second photo gate PGD in the time interval, a region like the region 'D' as shown in FIG. 2D may be reduced. Thus, in the structure of the pixel D_PXd, the degree of demodulation contrast may be improved to about 87.5%. The value of the degree of the demodulation contrast is merely an example value derived to describe the effect according to an example embodiment, and the effect of the inventive concepts are not limited thereto.

Figure 14:
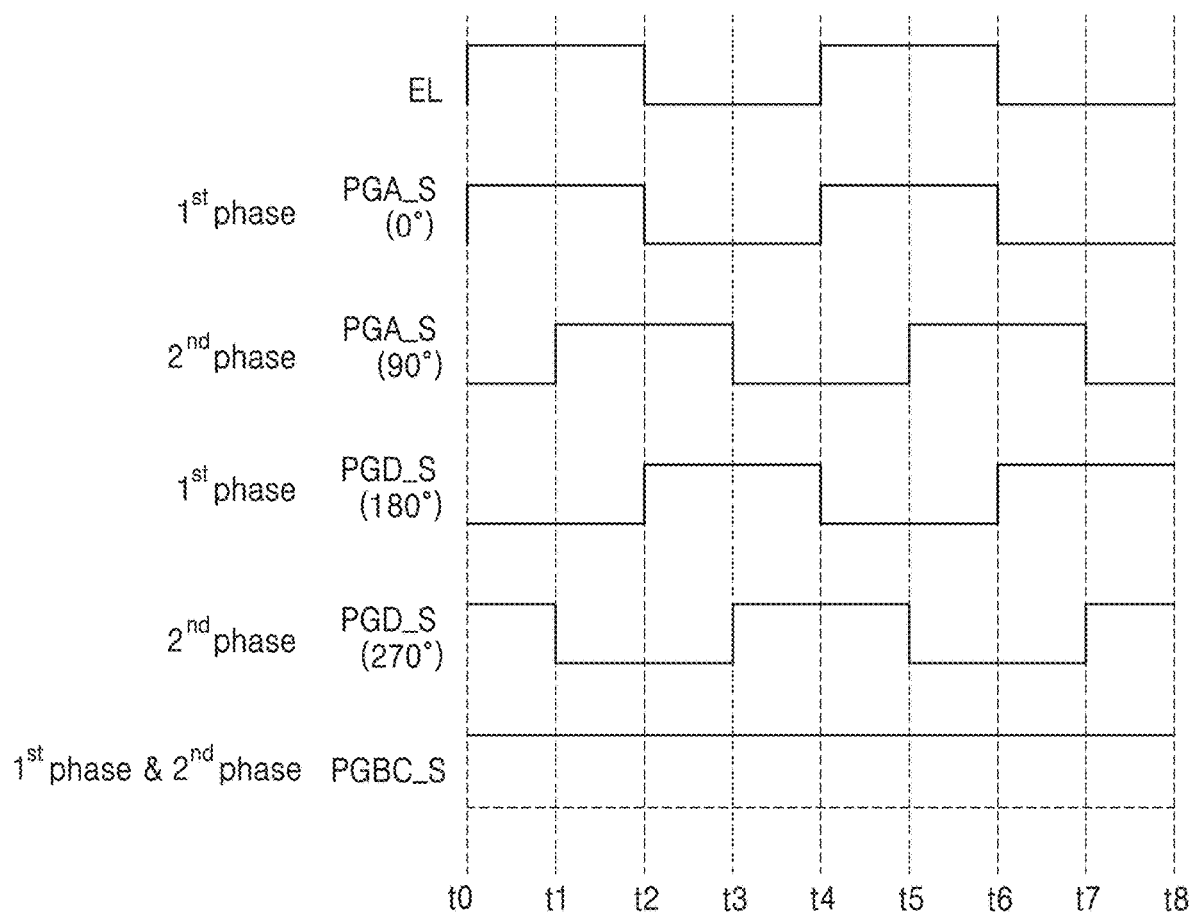
FIG. 14 is a diagram for describing gate signals and logic high signals applied to the photo gates of the pixel of FIG. 13A.

FIG. 14 is a diagram for describing a first gate signal PGA_S, a second gate signal PGD_S, and a logic high signal PGBC_S applied to the first photo gate PGA, the second photo gate PGB, the third photo gate PGC, and the fourth photo gate PGD of the pixel D_PXd of FIG. 13A.

Referring to FIGS. 13A and 14, the first gate signal PGA_S having the same phase as an optical signal EL emitted from the light source 15 (FIG. 1) may be applied to the first photo gate PGA, and the second gate signal PGD_S having a phase difference of 180° from the optical signal EL may be applied to the second photo gate PGD. In a second phase, the first gate signal PGA_S having a phase 90° different from that of the optical signal EL may be applied to the first photo gate PGA, and the second gate signal PGD_S having a phase 270° different from that of the optical signal EL may be applied to the second photo gate PGD. The logic high signal PGBC_S may be applied to the third photo gate PGB and the fourth photo gate PGC in the first phase and the second phase.

Figure 15:
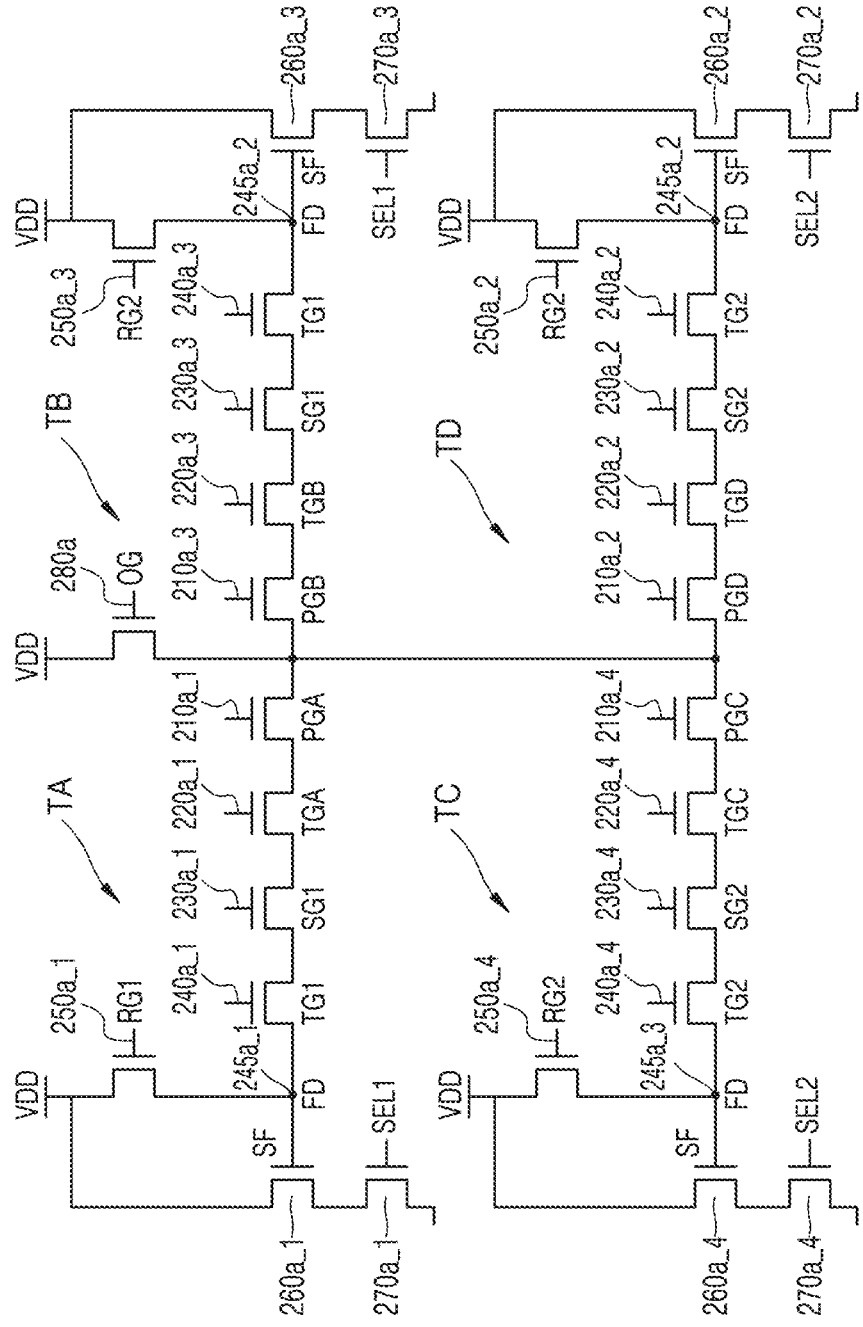
FIG. 15 is a circuit diagram of the pixel in FIG. 13A.

FIG. 15 is a circuit diagram of the pixel D_PXd in FIG. 13A. Hereinafter, the reference numbers of gates included in the first tap circuit TA may include '1', and the reference numbers of gates included in the second tap circuit TD may include '2', and the reference numbers of gates included in the third tap circuit TB may include '3', the reference numbers of gates included in the fourth tap circuit TC may include '4'.

Referring to FIG. 15, a pixel circuit D_PX_CKTe may have a 4-tap structure and include a first tap circuit TA, a second tap circuit TD, a third tap circuit TB, and a fourth tap circuit TC. The first tap circuit TA, the second tap circuit TD, the third tap circuit TB, and the fourth tap circuit TC each may include the photo gate 210a that generates charges and the gates-for-transfer 220a to 270a that store and transfer charges.

The first tap circuit TA and the second tap circuit TD may intersect with the third tap circuit TB and the fourth tap circuit TC. For example, the first tap circuit TA and the second tap circuit TD may be diagonally adjacent to each other, and the third tap circuit TB and the fourth tap circuit TC may be diagonally adjacent to each other. The first tap circuit TA may be adjacent to the third tap circuit TB in the X-axis direction, and the second tap circuit TD may be adjacent to the fourth tap circuit TC in the X-axis direction.

A first gate signal having a first phase difference from an optical signal may be applied to the first photo gate 210a_1 of the first tap circuit TA in a certain time interval for generating pixel signals for measuring a distance. A second gate signal having a second phase difference from the optical signal may be applied to the second photo gate 210a_2 of the second tap circuit TD in the time interval. Signals having a logic high value may be applied to the third photo gate 210a_3 of the third tap circuit TB and the fourth photo gate 210a_4 of the fourth tap circuit TC in the time interval. The pixel circuit D_PX_CKTe in FIG. 15 is the same as or substantially similar to the pixel circuit D_PX_CKTa in FIG. 4, and thus descriptions identical to those already given above will be omitted.

Figure 16A:
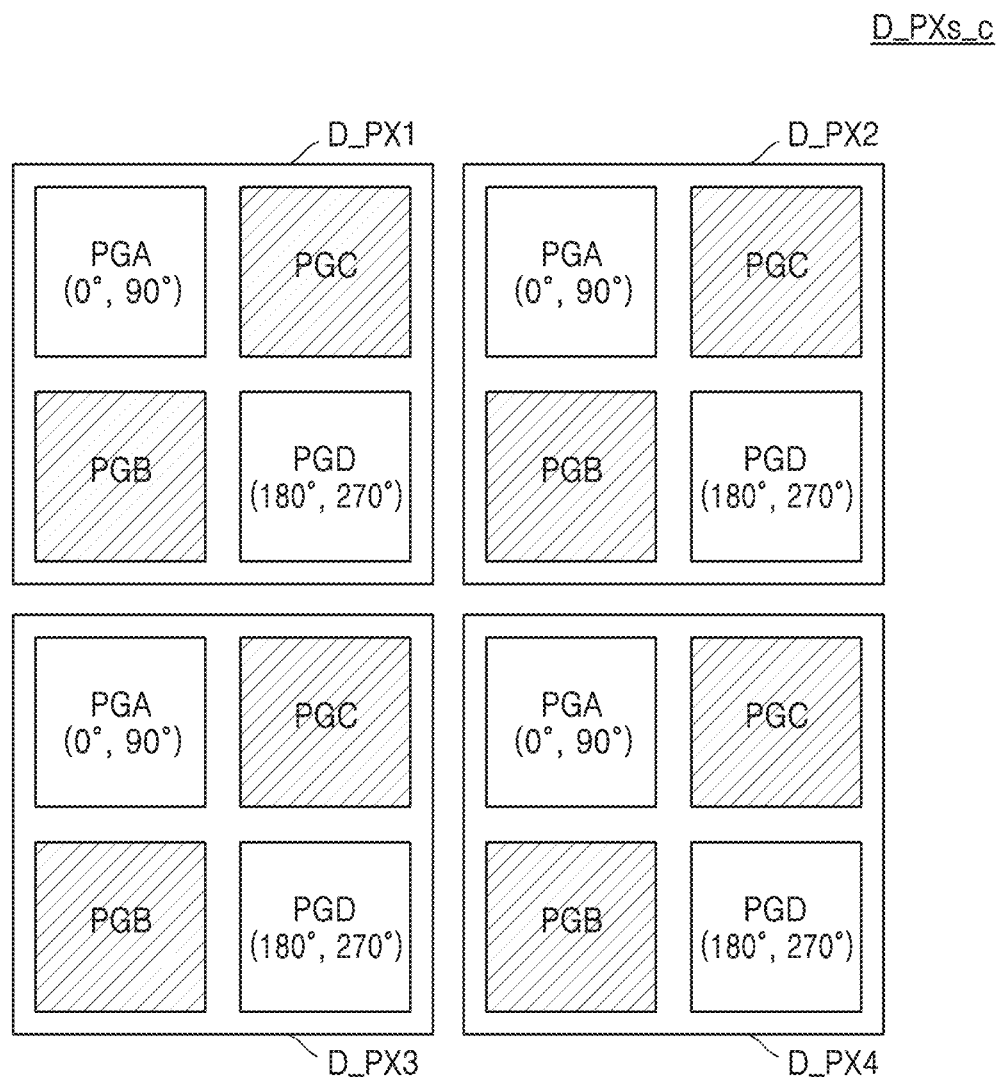
FIGS. 16A and 16B are diagrams for describing photo gate group arrangement patterns of pixels according some example embodiments.
Figure 16B:
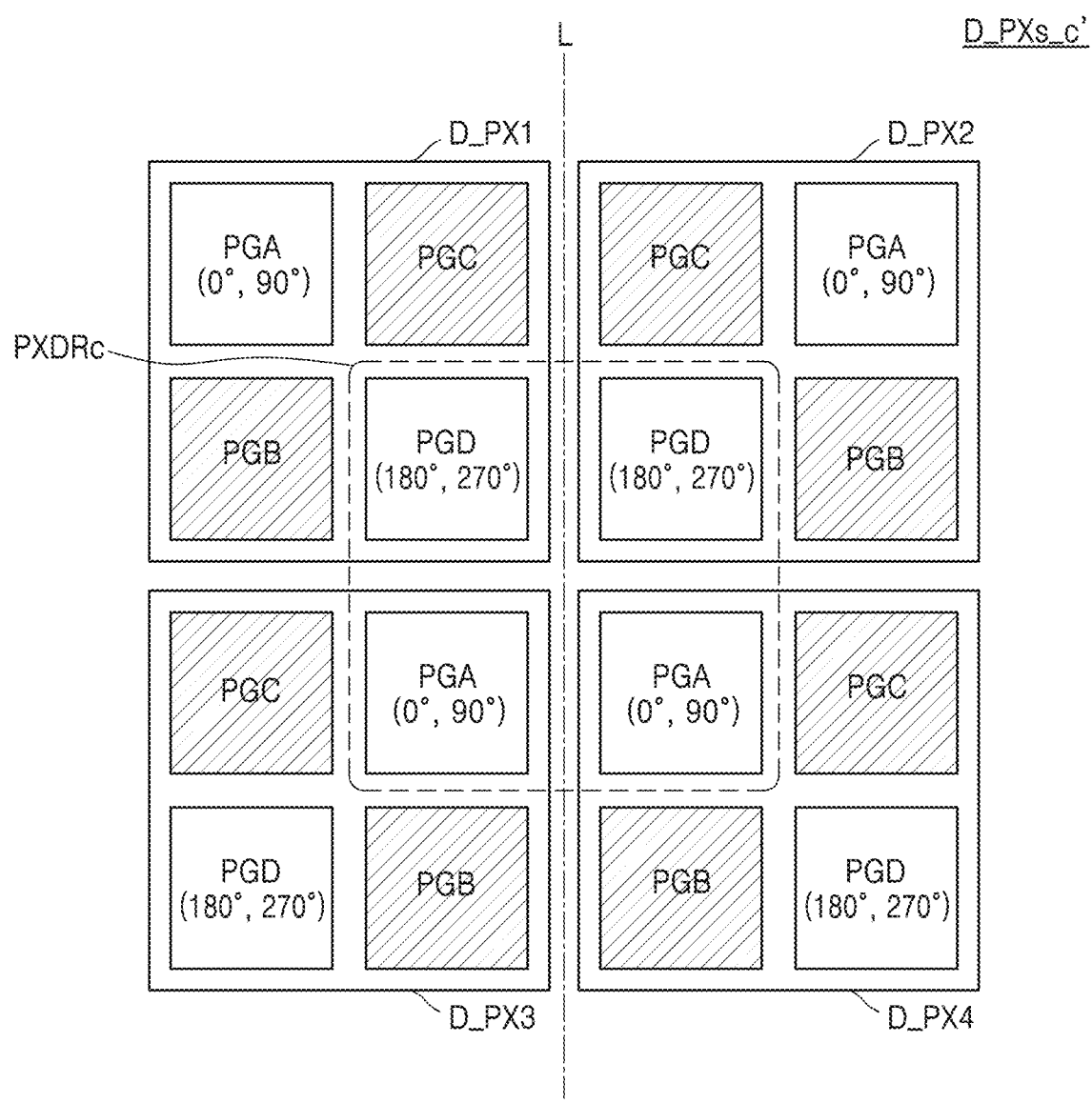

FIGS. 16A and 16B are diagrams for describing the photo gate group arrangement patterns of a pixel D_PXs_c and a pixel D_PXs_c' according some example embodiments.

Referring to FIG. 16A, the pixels D_PXs_c' may include the first pixel D_PX1, the second pixel D_PX2, the third pixel D_PX3, and the fourth pixel D_PX4, and the first pixel D_PX1, the second pixel D_PX2, the third pixel D_PX3, and the fourth pixel D_PX4 may have the same photo gate group arrangement pattern. For example, the first photo gate PGA and the second photo gate PGD of a first photo gate group in the first pixel D_PX1 may intersect with the third photo gate PGB and a fourth photo gate PGC of the second photo gate group, The photo gate arrangement pattern of the first pixel D_PX1 may be applied to the second pixel D_PX2, the third pixel D_PX3, and the fourth pixel D_PX4.

Referring to FIG. 16B, the photo gate arrangement pattern of each of the first pixel D_PX1, the second pixel D_PX2, the third pixel D_PX3, and the fourth pixel D_PX4 may be different from the photo gate arrangement pattern of pixels adjacent thereto in the X-axis direction and the Y-axis direction, and may also be different from the photo gate arrangement patterns of adjacent thereto in diagonal directions. For example, the photo gate arrangement pattern of the first pixel D_PX1 may be different from the photo gate arrangement patterns of the second pixel D_PX2, the third pixel D_PX3, and the fourth pixel D_PX4. In an example embodiment, the photo gate arrangement pattern of pixels D_PXs_c' may be symmetrical around a line 'L' that passes through the center of the pixels D_PXs_c' in the Y-direction.

Accordingly, in a phase for generating pixel signals in the pixels D_PXs_c', a region PXDRc where photo gates to which the same gate signals (e.g., gate signals having the same phase difference from an optical signal) are applied are densely arranged may be secured. The distance to the target object T (FIG. 1) may be accurately measured by binning pixel signals of the first pixel D_PX1, the second pixel D_PX2, the third pixel D_PX3, and the fourth pixel D_PX4 corresponding to characteristics of light received through the region PXDRc at various angles.

Figure 17A:
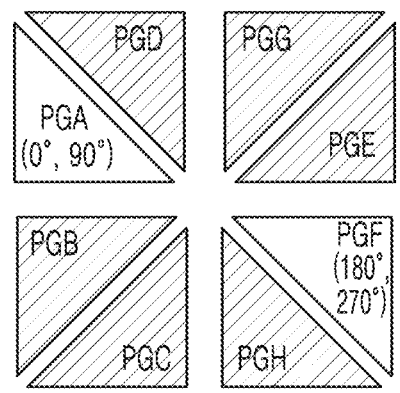
FIGS. 17A and 17B are diagrams showing pixels according some example embodiments.
Figure 17B:
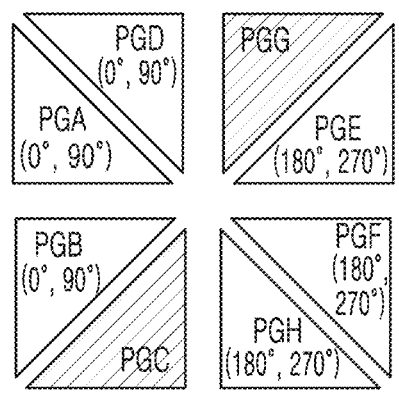

FIGS. 17A and 17B are diagrams showing a pixel D_PXe and a pixel D_PXe' according to some example embodiments.

Referring to FIG. 17A, the pixel D_PXe includes a first photo gate PGA, a second photo gate PGF, a third photo gate PGB, a fourth photo gate PGE, a fifth photo gate PGD, a sixth photo gate PGH, a seventh photo gate PGC, and an eighth photo gate PGG. The first photo gate PGA and the second photo gate PGF may be grouped into a first photo gate group, and the third photo gate PGB, the fourth photo gate PGE, the fifth photo gate PGD, the sixth photo gate PGH, the seventh photo gate PGC, and the eighth photo gate PGG may be grouped into a second photo gate group. In an example embodiment, the number of photo gates of the first photo gate group may be different from the number of photo gates of the second photo gate group. Pixel signals for measuring a distance may be generated by using the first photo gate PGA and the second photo gate PGF of the first photo gate group, and demodulation contrast performance may be improved by using the third photo gate PGB, the fourth photo gate PGE, the fifth photo gate PGD, the sixth photo gate PGH, the seventh photo gate PGC, and the eighth photo gate PGG of the second photo gate group.

Referring to FIG. 17B, the pixel D_PXe' includes the first photo gate PGA, the second photo gate PGF, the third photo gate PGB, the fourth photo gate PGE, the fifth photo gate PGD, the sixth photo gate PGH, the seventh photo gate PGC, and the eighth photo gate PGG. The first photo gate PGA, the second photo gate PGF, the third photo gate PGB, the fourth photo gate PGE, the fifth photo gate PGD, and the sixth photo gate PGH may be grouped into a first photo gate group, and the seventh photo gate PGC and the eighth photo gate PGG may be grouped into a second photo gate group. In an example embodiment, the number of photo gates of the first photo gate group may be different from the number of photo gates of the second photo gate group. Pixel signals for measuring a distance may be generated by using the first photo gate PGA, the second photo gate PGF, the third photo gate PGB, the fourth photo gate PGE, the fifth photo gate PGD, and the sixth photo gate PGH of the first photo gate group, and demodulation contrast performance may be improved by using the seventh photo gate PGC and the eighth photo gate PGG of the second photo gate group.

However, the example embodiments of the pixels D_PXe and D_PXe' in FIGS. 17A and 17B are merely examples, and the inventive concepts are not limited thereto. For example, a pixel may be implemented with a structure in which the number of photo gates of the first photo gate group is the same as or different from the number of photo gates of the second photo gate group.

Figure 18A:
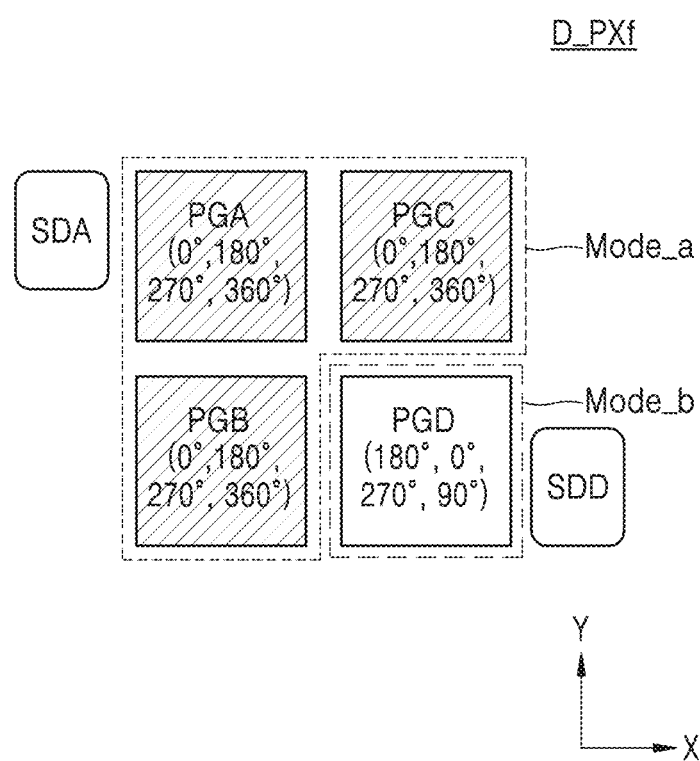
FIGS. 18A and 18B are diagrams showing pixels according some example embodiments.
Figure 18B:
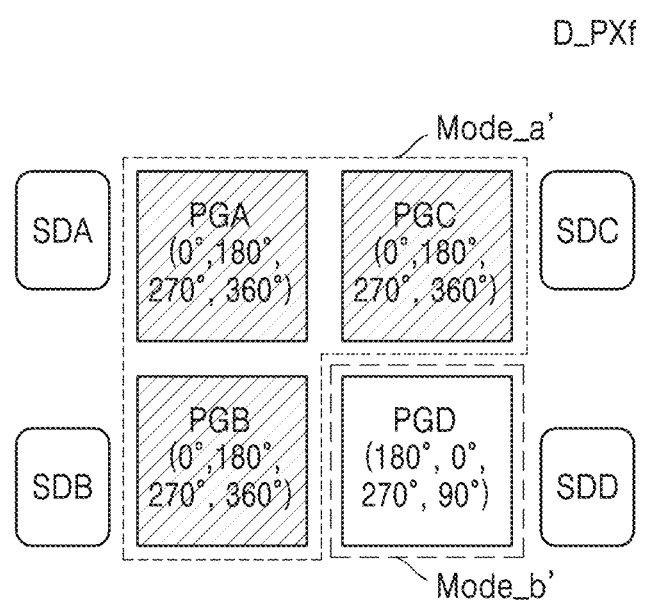

FIGS. 18A and 18B are diagrams showing a pixel D_PXf and a pixel D_PXf' according to some example embodiments.

Referring to FIG. 18A, the pixel D_PXf includes a first photo gate PGA, a second photo gate PGB, a third photo gate PGC, and a fourth photo gate PGD. The first photo gate PGA, the second photo gate PGB, and the third photo gate PGC may be grouped into a first photo gate group, and the fourth photo gate PGD may be grouped into a second photo gate group.

In an example embodiment, first gate signals having a variable phase difference (0°, 180°, 270°, or 360°) from an optical signal in a plurality of phases for generating first pixel signals used for measuring a distance according to a first mode Mode_a may be applied to the first photo gate PGA, the second photo gate PGB, and the third photo gate PGC of the first photo gate group, and second gate signals having a variable phase difference (180°, 0°, 270°, or 90°) from the optical signal in a plurality of phases for generating second pixel signals used for measuring a distance according to a second mode Mode_b may be applied to the fourth photo gate PGD of the second photo gate group.

In an example embodiment, the pixel D_PXf may have a 4-tap structure including four photo gates (e.g., the first photo gate PGA, the second photo gate PGB, the third photo gate PGC, and the fourth photo gate PGD). Phases of gate signals of the four photo gates may be adjusted to perform sensing over four time intervals as in an 1-tap structure for generating first and second pixel signals suitable for the structure of the pixel D_PXf and the first mode Mode_a and the second mode Mode_b and may be applied to the first photo gate PGA, the second photo gate PGB, the third photo gate PGC, and the fourth photo gate PGD.

In an example embodiment, some of charge storages corresponding to the first photo gate PGA (e.g., a charge storage SDA connected to the first photo gate PGA) may be used to generate first pixel signals, and a charge storage SDD connected to the fourth photo gate PGD of the second photo gate group may be used to generate second pixel signals. At this time, when the sensing condition of the image sensor 10 (FIG. 1) is low luminance, any one of the first mode Mode_a and the second mode Mode_b is selected, and pixel signals corresponding to the selected mode may be generated through the pixel D_PXf. In some example embodiments, when the sensing condition of the image sensor 10 (FIG. 1) is high luminance relative to a threshold luminance, the charge storage SDA used in the first mode Mode_a may be saturated faster than the charge storage SDD used in the second mode Mode_b, the second mode Mode_b may be selected, and thus second pixel signals corresponding to the second mode Mode_b may be generated via the second photo gate group (or the fourth photo gate PGD).

Referring to FIG. 18B, unlike in FIG. 18A, the charge storage SDA, a charge storage SDB, and a charge storage SDC corresponding to the first photo gate group may be used to generate first pixel signals in an example embodiment. In some example embodiments, when the sensing condition of the image sensor 10 (FIG. 1) is high luminance relative to the threshold luminance, a charge storage SDD used in the second mode Mode_b may be saturated faster than the charge storage SDA, the charge storage SDB, and the charge storage SDC used in a first mode Mode_a', the first mode Mode_a' may be selected, and thus first pixel signals corresponding to the first mode Mode_a' may be generated via the first photo gate group (or the first photo gate PGA, the second photo gate PGB, and the third photo gate PGC).

The dynamic range of the image sensor 10 (FIG. 1) may be improved through the structure of the pixels D_PXf and D_PXf' as shown in FIGS. 18A and 18B.

Figure 19:
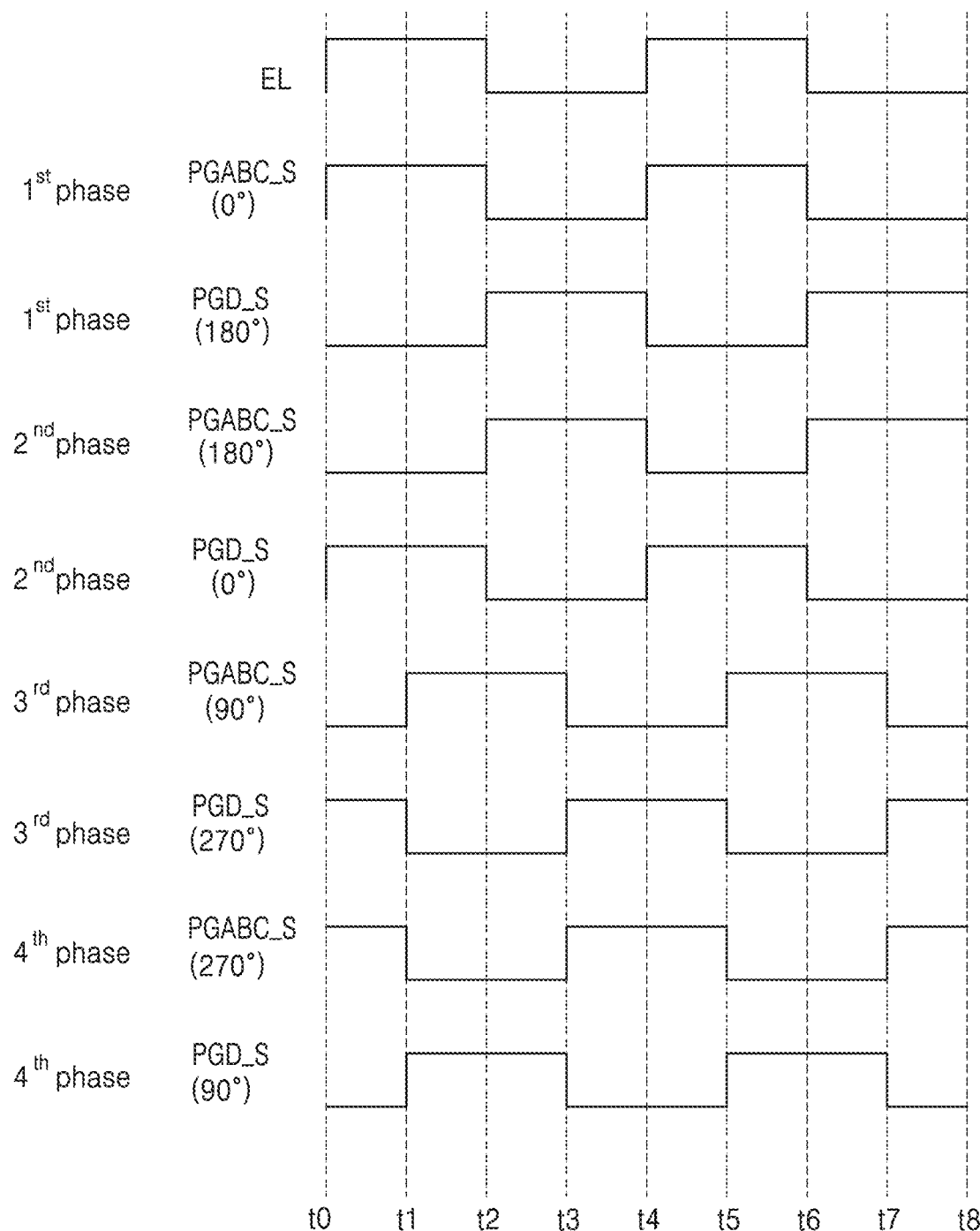
FIG. 19 is a diagram for describing gate signals applied to the photo gates of the pixel of FIG. 18A or 18B.

FIG. 19 is a diagram for describing first gate signals PGABC_S and second gate signals PGD_S applied to the first photo gate PGA, the second photo gate PGB, the third photo gate PGC, and the fourth photo gate PGD of the pixels D_PXf or D_PXf' in FIG. 18A or 18B.

Referring to FIG. 18A and FIG. 19, the first gate signal PGABC_S having the same phase as that of an optical signal EL emitted from the light source 15 (FIG. 1) in a first phase (or a sensing phase) may be applied to the first photo gate PGA, the second photo gate PGB, and the third photo gate PGC, whereas the second gate signal PGD_S having a phase 180° different from that of the optical signal EL may be applied to the fourth photo gate PGD. The first gate signals PGABC_S having a phase 180° difference from that of the optical signal EL in a second phase may be applied to the first photo gate PGA, the second photo gate PGB, and the third photo gate PGC, and the second gate signal PGD_S having a phase 0° different from that of the optical signal EL may be applied to the fourth photo gate PGD. In a third phase, the first gate signals PGABC_S having a phase 90° different from that of the optical signal EL may be applied to the first photo gate PGA, the second photo gate PGB, and the third photo gate PGC, and the second gate signal PGD_S having a phase 270° different from that of the optical signal EL may be applied to the fourth photo gate PGD. In a fourth phase, the first gate signals PGABC_S having a phase 270° different from that of the optical signal EL may be applied to the first photo gate PGA, the second photo gate PGB, and the third photo gate PGC, and the second gate signal PGD_S having a phase 90° different from that of the optical signal EL may be applied to the fourth photo gate PGD.

Figure 20:
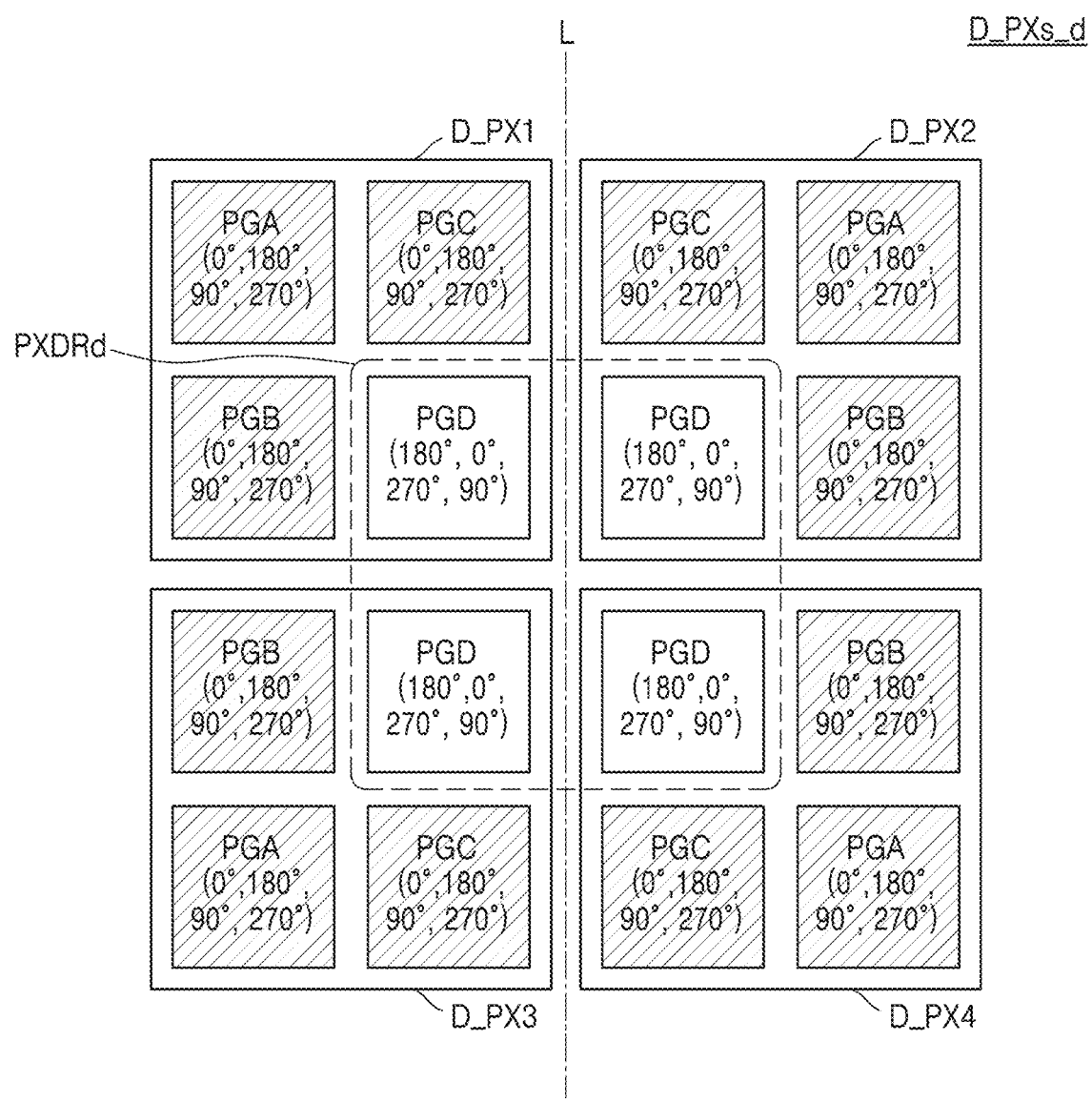
FIG. 20 is a diagram for describing a photo gate group arrangement pattern of pixels according to an example embodiment.

FIG. 20 is a diagram for describing a photo gate group arrangement pattern of the pixels D_PXs_d according to an example embodiment.

Referring to FIG. 20, the pixels D_PXs_d may include a first pixel D_PX1, a second pixel D_PX2, a third pixel D_PX3, and a fourth pixel D_PX4. The photo gate arrangement pattern of each of the first pixel D_PX1, the second pixel D_PX2, the third pixel D_PX3, and the fourth pixel D_PX4 may be different from those of pixels adjacent thereto in the X-axis direction and the Y-axis direction and may be different from those of pixels adjacent thereto in diagonal directions. For example, the photo gate arrangement pattern of the first pixel D_PX1 may be different from the photo gate arrangement patterns of the second pixel D_PX2, the third pixel D_PX3, and the fourth pixel D_PX4. In an example embodiment, the photo gate arrangement pattern of pixels D_PXs_d may be symmetrical around a line 'L' that passes through the center of the pixels D_PXs_d in the Y-direction.

Accordingly, in a phase for generating pixel signals in the pixels D_PXs_d, a region PXDRc where photo gates to which the same gate signals (e.g., gate signals having the same phase difference from an optical signal) are applied in the same mode are densely arranged may be secured. The distance to the target object T (FIG. 1) may be accurately measured by binning pixel signals of the first pixel D_PX1, the second pixel D_PX2, the third pixel D_PX3, and the fourth pixel D_PX4 corresponding to characteristics of light received through the region PXDRc at various angles.

Figure 21:
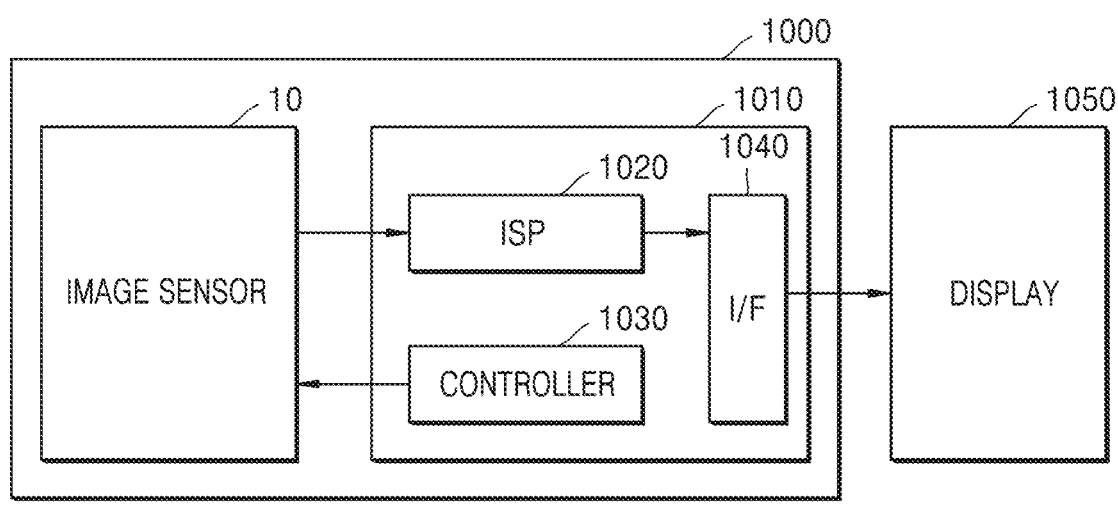
FIG. 21 is a diagram showing an image processing system including the image sensor of FIG. 1.

FIG. 21 is a diagram showing an image processing system 1000 including the image sensor 10 of FIG. 1.

Referring to FIG. 21, the image processing system 1000 includes the image sensor 10 of FIG. 1 and a processor 1010. The processor 1010 includes an image sensor controller 1030, an image signal processor 1020, and an interface 1040. The image sensor controller 1030 may output a control signal to the image sensor 10. In an example embodiment, the image sensor controller 1030 may select a mode according to the sensing condition of the image sensor 10 to control the image sensor 10 to generate pixel signals suitable for the selected mode. The image signal processor 1020 may measure a distance to the target object by using pixel signals output from the image sensor 10 and generate a 3D image based on a result of the measurement. For example, the image signal processor 1020 may perform pixel signal processing operations suitable for the various pixel structures of the image sensors 10 described above with reference to FIGS. 1 to 20. Furthermore, the image signal processor 1020 may perform a binning operation, an interpolation operation, and the like in consideration of the pixel structure of the image sensor 10.

The image sensor controller 1030, the image signal processor 1020, and the interface 1040 may be functional units of the processor 1010. However, the processor 1010 is not intended to be limited to the disclosed functional units. In some example embodiments, additional functional units may be included in the processor 1010. Further, the processor 1010 may perform the operations and/or functions of the various functional units without sub-dividing the operations and/or functions of the various functional units into these various functional units.

The processor 1010 may be processing circuitry such as hardware including logic circuits, a processing unit including software and a core executing the software, or a combination of the hardware and the processing unit. For example, the processing circuitry may include, but is not limited to, a microprocessor, an image processor, Central Processing Unit (CPU), a controller, an arithmetic logic unit (ALU), a digital signal processor, a microcomputer, a field programmable gate array (FPGA), a System-on-Chip (SoC), a programmable logic unit, or any other type of application-specific integrated circuits (ASIC) capable of responding to and executing instructions in a defined manner.

Although not specifically illustrated, the processor 1010 may include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The interface 1040 may transmit the 3D image to the display 1050 for playback.

While the inventive concepts have been particularly shown and described with reference to some example embodiments thereof, it will be understood that various changes in form and details may be made therein without departing from the spirit and scope of the following claims.

What is claimed is:

1. An image sensor comprising:
a light source configured to emit an optical signal to a target object; and
a pixel array comprising a first pixel, the first pixel configured to generate pixel signals based on the optical signal reflected from the target object,
wherein the first pixel comprises a first photo gate group and a second photo gate group, the first photo gate group comprising at least two photo gates configured to receive first gate signals having a first phase difference from the optical signal in a time interval, the second photo gate group comprising at least two photo gates configured to receive second gate signals having a second phase difference from the optical signal in the time interval.

2. The image sensor of claim 1, wherein the first gate signals have a phase 180° different from that of the second gate signals.

3. The image sensor of claim 2, wherein
the first pixel is configured to generate the pixel signals over two time intervals, and
the first phase difference and the second phase difference change in each of the two time intervals.

4. The image sensor of claim 2, wherein the at least two photo gates included in the second photo gate group include drain gates to one end of which a power voltage is directly applied.

5. The image sensor of claim 4, wherein the first pixel is configured to generate the pixel signals over four time intervals, and the first phase difference and the second phase difference change in each of the four time intervals.

6. The image sensor of claim 1, wherein
the at least two photo gates included in the first photo gate group comprise a first photo gate and a second photo gate that are diagonally adjacent to each other, and
the at least two photo gates included in the second photo gate group comprise a third photo gate and a fourth photo gate that are diagonally adjacent to each other.

7. The image sensor of claim 6, wherein the first photo gate is adjacent to the third photo gate in a first direction, and the second photo gate is adjacent to the fourth photo gate in the first direction.

8. The image sensor of claim 1, wherein
the pixel array further comprises a second pixel adjacent to the first pixel in a first direction or a second direction perpendicular to the first direction,
the second pixel comprises a third photo gate group and a fourth photo gate group, the third photo gate group comprising at least two photo gates to which the first gate signals are applied in the time interval, and the fourth photo gate group comprising at least two photo gates to which the second gate signals are applied in the time interval, and
arrangement patterns of the first photo gate group and the second photo gate group of the first pixel are one of the same as or different from arrangement patterns of the third photo gate group and the fourth photo gate group of the second pixel.

9. The image sensor of claim 8, wherein
when the first photo gate group and the second photo gate group of the first pixel are arranged different from the third photo gate group and the fourth photo gate group of the second pixel,
one of the at least two photo gates of the first photo gate group of the first pixel is adjacent to one of the at least two photo gates of the third photo gate group of the second pixel in the first direction, and
one of the at least two photo gates of the second photo gate group of the first pixel is adjacent to one of the at least two photo gates of the fourth photo gate group of the second pixel in the first direction.

10. The image sensor of claim 1, wherein the first pixel further comprises a third photo gate group and a fourth photo gate group, the third photo gate group comprising at least two photo gates configured to receive third gate signals having a third phase difference from the optical signal in the time interval, the fourth photo gate group comprising at least two photo gates configured to receive fourth gate signals having a fourth phase difference from the optical signal in the time interval.

11. The image sensor of claim 10, wherein a phase difference between each of the first gate signals and the fourth gate signals is 270°.

12. The image sensor of claim 10, wherein the first pixel is configured to generate the pixel signals over one time interval.

13. The image sensor of claim 1, wherein
the first pixel further comprises first tap circuits corresponding to the first photo gate group and second tap circuits corresponding to the second photo gate group, and
the first tap circuits and the second tap circuits are diagonally adjacent to each other in the first pixel.

14. The image sensor of claim 13, wherein
one of the first tap circuits is adjacent to one of the second tap circuits in a first direction, and
another one of the first tap circuits is adjacent to another one of the second tap circuits in the first direction.

15. An image sensor comprising:
a light source configured to emit an optical signal to a target object; and
a pixel array comprising a first pixel, the first pixel configured to generate pixel signals based on the optical signal reflected from the target object,
wherein the first pixel comprises a first photo gate group and a second photo gate group, the first photo gate group comprising at least two photo gates configured to receive first gate signals each having a phase difference from the optical signal in a time interval, and the second photo gate group comprising at least two photo gates configured to receive second gate signals having a logic high value in the time interval.

16. The image sensor of claim 15, wherein
the at least two photo gates included in the first photo gate group comprise a first photo gate and a second photo gate that are diagonally adjacent to each other, and
the at least two photo gates included in the second photo gate group comprise a third photo gate and a fourth photo gate that are diagonally adjacent to each other.

17. The image sensor of claim 16, wherein
the first photo gate is configured to receive one of the first gate signals that has a first phase difference from the optical signal in the time interval, and
the second photo gate is configured to receive another of the first gate signals that has a second phase difference from the optical signal in the time interval.

18. The image sensor of claim 15, wherein
the first pixel further comprises tap transfer gates corresponding to the second photo gate group, and
the tap transfer gates are configured to receive third gate signals having a logic low value in the time interval.

19. The image sensor of claim 15, wherein
the pixel array further comprises a second pixel that is adjacent to the first pixel in a first direction or a second direction perpendicular to the first direction,
the second pixel comprises a third photo gate group and a fourth photo gate group, the third photo gate group comprising at least two photo gates configured to receive the first gate signals, the fourth photo gate group comprising at least two photo gates configured to receive the second gate signals, and
arrangement patterns of the first photo gate group and the second photo gate group of the first pixel are one of the same as or different from arrangement patterns of the third photo gate group and the fourth photo gate group of the second pixel.

20. An image sensor comprising:
a light source configured to emit an optical signal to a target object; and
a pixel array comprising a first pixel, the first pixel configured to generate pixel signals based on the optical signal reflected from the target object,
wherein the first pixel comprises a first photo gate group and a second photo gate group, the first photo gate group comprising a plurality of first photo gates configured to receive first gate signals each having a variable phase difference from the optical signal in a plurality of time intervals and generate first pixel signals according to a first mode, the second photo gate group comprising a plurality of second photo gates configured to receive second gate signals each having a variable phase difference from the optical signal in the plurality of time intervals and generate second pixel signals according to a second mode.

* * * * *